(12) United States Patent
Michael et al.

(10) Patent No.: US 9,806,001 B2
(45) Date of Patent: Oct. 31, 2017

(54) CHIP-SCALE PACKAGING WITH PROTECTIVE HEAT SPREADER

(71) Applicant: Volterra Semiconductor LLC, San Jose, CA (US)

(72) Inventors: Mihalis Michael, San Ramon, CA (US); Ilija Jergovic, Palo Alto, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 0 days.

(21) Appl. No.: 14/753,514

(22) Filed: Jun. 29, 2015

(65) Prior Publication Data

US 2015/0303127 A1    Oct. 22, 2015

Related U.S. Application Data

(62) Division of application No. 12/716,197, filed on Mar. 20, 2010, now Pat. No. 9,070,662.

(Continued)

(51) Int. Cl.
*H01L 23/367* (2006.01)
*H01L 23/31* (2006.01)
(Continued)

(52) U.S. Cl.
CPC ......... *H01L 23/3675* (2013.01); *H01L 21/56* (2013.01); *H01L 23/3107* (2013.01); *H01L 23/3114* (2013.01); *H01L 23/367* (2013.01); *H01L 23/3672* (2013.01); *H01L 23/42* (2013.01); *H01L 24/27* (2013.01);
(Continued)

(58) Field of Classification Search
CPC ... H01L 23/3675; H01L 23/36; H01L 23/367; H01L 23/3672; H01L 23/3677
See application file for complete search history.

(56) References Cited

U.S. PATENT DOCUMENTS 4,654,966 A    4/1987 Kohara et al.
5,298,791 A *  3/1994 Liberty ................. H01L 23/367
                                                        257/707

(Continued)

OTHER PUBLICATIONS

International Search Report and Written Opinion for International Application No. PCT/US2010/026276, filed Mar. 4, 2010, 10 pages.

*Primary Examiner* — Matthew Gordon
*Assistant Examiner* — Gardner W Swan
(74) *Attorney, Agent, or Firm* — Lathrop Gage LLP

(57) ABSTRACT

A semiconductor package can include a semiconductor die having an integrated circuit, a first die surface, and an opposite second die surface. A packaging can be attached to the die and have a holder surface opposite the first die surface. A heat spreader can be configured to cover the second die surface and the packaging surface and can be attached thereto by a layer of adhesive positioned between the heat spreader and the semiconductor die. A semiconductor package array can include an array of semiconductor dies and a heat spreader configured to cover each semiconductor die. A conductive lead can be electrically connected to the integrated circuit in a semiconductor die and can extend from the first die surface. Manufacturing a semiconductor package can include applying thermally conductive adhesive to the heat spreader and placing the heat spreader proximate the semiconductor die.

7 Claims, 14 Drawing Sheets

Related U.S. Application Data

(60) Provisional application No. 61/157,883, filed on Mar. 5, 2009.

(51) Int. Cl.
  *H01L 23/42* (2006.01)
  *H01L 21/56* (2006.01)
  *H01L 23/00* (2006.01)

(52) U.S. Cl.
  CPC .............. *H01L 24/32* (2013.01); *H01L 24/75* (2013.01); *H01L 24/83* (2013.01); *H01L 24/92* (2013.01); *H01L 24/97* (2013.01); *H01L 24/13* (2013.01); *H01L 24/29* (2013.01); *H01L 24/73* (2013.01); *H01L 2224/131* (2013.01); *H01L 2224/13082* (2013.01); *H01L 2224/16225* (2013.01); *H01L 2224/16227* (2013.01); *H01L 2224/2731* (2013.01); *H01L 2224/32245* (2013.01); *H01L 2224/73253* (2013.01); *H01L 2224/75745* (2013.01); *H01L 2224/81191* (2013.01); *H01L 2224/838* (2013.01); *H01L 2224/83191* (2013.01); *H01L 2224/83192* (2013.01); *H01L 2224/83193* (2013.01); *H01L 2224/83855* (2013.01); *H01L 2224/83862* (2013.01); *H01L 2224/83874* (2013.01); *H01L 2224/92242* (2013.01); *H01L 2224/97* (2013.01); *H01L 2224/98* (2013.01); *H01L 2924/00014* (2013.01); *H01L 2924/14* (2013.01); *H01L 2924/1426* (2013.01); *H01L 2924/181* (2013.01)

(56) References Cited

U.S. PATENT DOCUMENTS

| | | | |
|---|---|---|---|
| 5,362,680 A | 11/1994 | Heinen et al. | |
| 5,396,403 A | 3/1995 | Patel | |
| 5,397,921 A | 3/1995 | Karnezos | |
| 5,589,711 A * | 12/1996 | Sano | H01L 23/4006 257/659 |
| 5,909,056 A | 6/1999 | Mertol | |
| 5,909,057 A * | 6/1999 | McCormick | H01L 21/563 257/680 |
| 6,163,956 A | 12/2000 | Corisis | |
| 6,214,640 B1 | 4/2001 | Fosberry et al. | |
| 6,278,182 B1 * | 8/2001 | Liu | H01L 21/565 257/667 |
| 6,314,639 B1 | 11/2001 | Corisis | |
| 6,348,363 B1 | 2/2002 | Chung et al. | |
| 6,433,420 B1 * | 8/2002 | Yang | H01L 21/565 257/667 |
| 6,505,400 B1 | 1/2003 | Corisis | |
| 6,891,259 B2 * | 5/2005 | Im | H01L 23/16 257/687 |
| 7,256,493 B2 * | 8/2007 | Meyer-Berg | H01L 23/3675 257/707 |
| 7,787,250 B2 * | 8/2010 | Li | H01L 23/04 361/715 |
| 8,018,072 B1 * | 9/2011 | Miks | H01L 23/4334 257/667 |
| 2001/0048157 A1 * | 12/2001 | Murtuza | H01L 23/3114 257/734 |
| 2003/0084566 A1 * | 5/2003 | Corisis | H01L 23/3672 29/854 |
| 2005/0116335 A1 * | 6/2005 | Karim | H01L 23/4334 257/718 |
| 2006/0087033 A1 | 4/2006 | Goh et al. | |
| 2006/0090931 A1 | 5/2006 | Hashimoto | |
| 2006/0186533 A1 | 8/2006 | Corisis | |
| 2007/0109749 A1 | 5/2007 | Kwon | |
| 2007/0158859 A1 | 7/2007 | Hierholzer | |
| 2007/0216009 A1 | 9/2007 | Ng | |
| 2007/0258683 A1 | 11/2007 | Rolston et al. | |

* cited by examiner

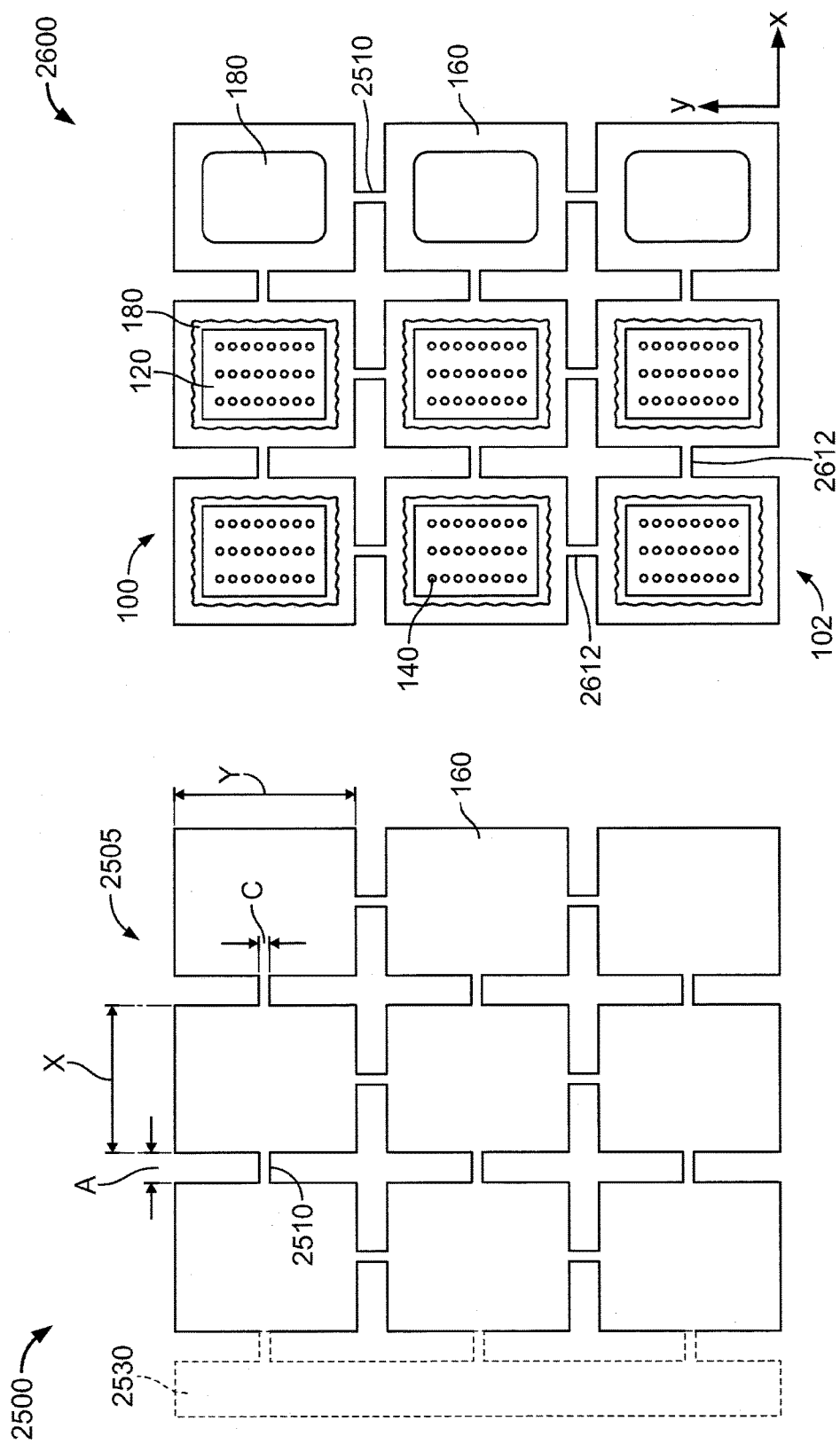

CHIP-SCALE PACKAGING WITH PROTECTIVE HEAT SPREADER

CROSS-REFERENCE TO RELATED APPLICATIONS

This application is a divisional of U.S. patent application Ser. No. 12/716,197, filed Mar. 2, 2010, which claims benefit priority to U.S. patent application Ser. No. 61/157,883, filed on Mar. 5, 2009. Each of the above-mentioned applications is incorporated herein by reference.

TECHNICAL FIELD

This description relates to a semiconductor package including a heat spreader.

BACKGROUND

An integrated circuit can be fabricated on a semiconductor die. The die can also be referred to as a chip, and the die can be a so-called "flip chip." A flip chip has a surface that includes conductive protrusions, which can be referred to as "bumps." The die can be fragile and vulnerable to damage during handling. The die may be protected by a coating of epoxy or plastic. The die can also be mounted on an interposer, and the interposer can be handled instead of or in addition to the die.

An integrated circuit on the die can generate heat during operation, and a heat sink may be necessary to transfer heat from the die to a surrounding environment. A heat sink can be attached to the die with a thermal pad between the heat sink and the die. The thermal pad can be made removable upon removal of the heat sink. Compression of the thermal pad can facilitate thermal conductivity between the die and the heat sink. Some thermals pads include a metal core or a metal layer.

Corners and edges of the die, in particular, may be fragile and easily damaged due to stress concentration and heightened pressure. For example, the corners and edges of the die are likely to have a relatively small contact area with objects that contact the die, as compared to flat surfaces of the die. In particular, contact between a heat sink and the die may damage the die. Placement of the thermal pad may need to be precise for the pad to protect the entire die from damage by the heat sink during attachment.

The die can be mounted on an interposer, and the conductive leads can be electrically connected to wire leads of the interposer. The die can be bonded to the interposer mechanically or by an adhesive or thermosetting plastic that encases the die.

SUMMARY

This disclosure relates to a semiconductor package including a heat spreader.

In one aspect, the apparatus and methods described herein include a semiconductor package having a semiconductor die including an integrated circuit and having a first die surface and an opposite second die surface. A conductive lead can be electrically connected to the integrated circuit and can extend from the first die surface. The conductive lead can be configured to contact a conductive portion on a printed circuit board surface. A heat spreader can be configured to cover the second die surface and can be attached to the second die surface by a layer of adhesive positioned between the heat spreader and the semiconductor die.

In another aspect, manufacturing a semiconductor package can include forming a semiconductor die that includes a conductive lead on a first surface of the semiconductor die. A thermally conductive adhesive can be applied to an opposite second surface of the semiconductor die or to a surface of a heat spreader or both. The heat spreader can be placed proximate the semiconductor die and in contact with the thermally conductive adhesive. The thermally conductive adhesive can be cured.

In another aspect, a semiconductor package includes a semiconductor die having a die top surface, packaging at least partially surrounding the die, and a heat spreader configured to cover the die top surface. The heat spreader is attached to the die by a layer of adhesive positioned between the heat spreader and the die, and a perimeter of the heat spreader extends beyond the semiconductor die and packaging.

Implementations may include one or more of the following. The packaging may surround substantially all surfaces of the die except the die top surface. The packaging may include a mold compound or an underfill material. The packaging may include an interposer. The packaging may include a packaging surface that is flush with the die surface. The packaging may be attached to the heat spreader by an adhesive. The packaging may surround a perimeter of the die. An area of the heat spreader may be larger than a sum of an area of the die top surface and an area of a surface of the packaging that is parallel to the die top surface. A bottom surface of the heat spreader may include a recess and the layer of adhesive may be positioned at least partially in the recess. The semiconductor die may include a monolithically integrated power switch and its driver. The adhesive may be thermally conductive. The adhesive may be an epoxy or a solder. The heat spreader may be substantially rigid. The heat spreader may include a metal, e.g., copper, and may be coated with nickel or black oxide. A heat sink may be attached to the heat spreader.

In another aspect, a semiconductor assembly includes a plurality of semiconductor dies, each die including an integrated circuit and having a first die surface and an opposite second die surface, a conductive lead electrically connected to the integrated circuit and extending from each first die surface and configured to contact a conductive portion on a printed circuit board surface, and a unitary heat spreader configured to cover each second die surface and attached thereto by a layer of adhesive positioned between the heat spreader and each semiconductor die.

Implementations may include one or more of the following. The plurality of semiconductor dies may include at least one row of semiconductor dies.

In another aspect, a semiconductor assembly array includes a plurality of semiconductor dies, a conductive lead for each die, and an array of heat spreaders. Each die includes an integrated circuit having a first die surface and an opposite second die surface. The conductive lead is electrically connected to the integrated circuit and extends from each first die surface and is configured to contact a conductive portion on a printed circuit board surface. The array of heat spreaders has adjacent heat spreaders proximately connected. The array of heat spreaders is configured to cover each second die surface and is attached thereto by a layer of adhesive positioned between a heat spreader of the array of heat spreaders and each semiconductor die.

Implementations may include one or more of the following. The array of heat spreaders may include a plurality of rows, each row including a plurality of heat spreaders. The heat spreaders may be arranged in a regular rectangular array. The heat spreaders may have the same shape or different shapes. The plurality of semiconductor dies may include a plurality of rows, each row of the plurality of rows including two or more semiconductor dies. The semiconductor dies may be arranged in a regular rectangular array. The semiconductor dies may have the same shape or different shapes. A spacing between adjacent heat spreaders may be less than widths of the adjacent heat spreaders. A connection between adjacent heat spreaders may consist of straight line path. A connection between opposed edges of adjacent heat spreaders need not extend laterally past ends of the opposed edges. Opposing edges of adjacent heat spreaders may be connected only to each other. Adjacent heat spreaders may be connected by one or more struts that are narrower than the adjacent heat spreaders. Adjacent heat spreaders may be connected by exactly one strut or by a plurality of struts. The one or more struts may be thinner than the adjacent heat spreaders. A connector between adjacent heat spreaders may extend across an entire width of the adjacent heat spreaders. The connector may be thinner than the adjacent heat spreaders. Adjacent heat spreaders may be connected along a line of perforations. The semiconductor die may include a monolithically integrated power switch and its driver. The conductive lead may include solder or a conductive metal plating. The adhesive may be thermally conductive. The adhesive may be epoxy or solder. The heat spreader may be substantially rigid. The heat spreader may include a metal, e.g., copper, and may be coated with nickel or black oxide. The heat spreader may include metal coated with a dielectric. A plurality of semiconductor dies may be attached to a unitary heat spreader. The array of heat spreaders may be a unitary body. A heat sink may be attached to the heat spreader. Packaging may at least partially surround the die, and a perimeter of the heat spreader may extend beyond the semiconductor die and packaging. The packaging may include an interposer and the conductive lead may include a conductive portion of the interposer. The conductive lead may include a solder bump on the die.

In another aspect, a method of manufacturing a semiconductor array includes forming a plurality of semiconductor dies, each semiconductor die of the plurality of semiconductor dies including a first surface and a conductive lead on the first surface, forming an array of heat spreaders with adjacent heat spreaders proximately connected, applying an adhesive to an opposite second surface of each semiconductor die or to a surface of each heat spreader of a plurality of heat spreaders from the array of heat spreaders, bringing the plurality of heat spreaders proximate the plurality of semiconductor dies such that each semiconductor die is connected to an associated heat spreader with the thermally conductive adhesive, and curing the thermally conductive adhesive.

Implementations may include one or more of the following. Forming the plurality of semiconductor dies may include forming a plurality of rows, each row of the plurality of rows including two or more semiconductor dies. Forming the array of heat spreaders may include forming a plurality of rows, each row including a plurality of heat spreaders. The semiconductor die may include a monolithically integrated power switch and its driver. The adhesive may be thermally conductive. Applying the adhesive may include printing the adhesive. A portion of the heat spreader surrounding each semiconductor die may be singulated. Packaging may be applied to the dies, and a perimeter of the heat spreader may extend beyond the semiconductor die and packaging. The packaging may surround substantially all surfaces of the semiconductor die except the second surface of the semiconductor die. Applying an adhesive may include applying adhesive to both the opposite second surface of each semiconductor die and to a surface of each heat spreader of the plurality of heat spreaders.

In another aspect, a semiconductor package includes a semiconductor die having a die surface and a heat spreader configured to cover the die top surface. The heat spreader is attached to the die by a layer of adhesive positioned between the heat spreader and the die, a perimeter of the heat spreader extends beyond a perimeter of the die, and a perimeter of the adhesive extends beyond the perimeter of the die. In another aspect, a semiconductor package includes a semiconductor die having a top surface, and a heat spreader assembly configured to cover the top surface. The heat spreader assembly is attached to the die by a layer of adhesive positioned between the heat spreader and the die, a perimeter of the heat spreader assembly extends beyond a perimeter of the die, and the heat spreader assembly includes at least one aperture over the top surface.

Implementations may include one or more of the following. The aperture may be filled with the adhesive. The heat spreader assembly may be a unitary body. The heat spreader assembly may include a plurality of coplanar portions separated by at least one gap, the gap providing the at least one aperture.

In another aspect, a semiconductor package includes a semiconductor die having a top surface, and a heat spreader configured to cover the top surface. The heat spreader is attached to the die by a layer of adhesive positioned between the heat spreader and the die, a perimeter of the heat spreader extends beyond a perimeter of the die and includes a downwardly projecting portion.

Implementations may include one or more of the following. The downwardly projecting portion may be configured to attach to the printed circuit board using a thermally conductive material. The downwardly projecting portion may define a recess in the heat spreader. The downwardly projecting portions may extend vertically beyond the top surface of the semiconductor die. A lower surface of the downwardly projecting portion may be flush with bottom surfaces of leads of the semiconductor die. The lower surface of the downwardly projecting portions may be plated with a coating that is wettable to solder.

Implementations can include one or more of the following features. The semiconductor die can include silicon. Attaching the semiconductor package to the surface of the printed circuit board can include melting at least a portion of the conductive lead. Assembling a semiconductor package can also include attaching a heat sink to the heat spreader.

The above-described implementations can provide none, some, or all of the following advantages. Packaging the die with the heat spreader can mitigate or prevent damage to the die during some or all of handling of the die, mounting of the die, and mounting of a heat sink to the die. The heat spreader can serve as a structure by which the die can be relatively easily and safely handled, as compared to handling the die directly. The heat spreader can serve as an attachment point for a variety of heat sinks that can each be suitable for a particular surrounding operating environment. The heat spreader can spread heat evenly from the die across the heat sink bottom surface. Attaching a heat spreader, rather than a heat sink, to the die prior to attaching the die to a printed circuit board can also mitigate or prevent damage to the die during shipping and handling that could be caused by the large mass of the heat sink as compared to the heat spreader.

DESCRIPTION OF DRAWINGS

FIG. 2K is a schematic representation of an array of heat spreaders.

FIG. 2L is a schematic representation of an array of heat spreaders and dies.

Like reference symbols in the various drawings indicate like elements.

DETAILED DESCRIPTION

A semiconductor package can be implemented with a semiconductor die having conductive leads. A heat spreader can be attached to the die by an adhesive, such as a thermally conductive adhesive. The heat spreader can include, or be composed of, a thermally conductive material, for example, copper, aluminum, or carbon. In some implementations, a width of the heat spreader can be larger than a width, in a same direction, of the die to which the heat spreader is attached. That is, the heat spreader can extend beyond edges or corners of the die.

The die can be configured to attach to a printed circuit board. The conductive leads can be conductive bumps that correspond to conductive portions of the printed circuit board. Alternatively, the conductive leads can be wire leads or wire bonds. The heat spreader can be attached to the die before the die is attached to the printed circuit board. In particular, the heat spreader can be attached to the die by the chip manufacturer or semiconductor device assembler to form the package, and the package can be shipped as a unit to a circuit board assembler, e.g., a computer manufacturer, who will place the package on a circuit board. After the package with the die is mounted on the printed circuit board, a heat sink can be attached to the heat spreader to facilitate heat exchange between the die and a surrounding operating environment.

Figure 1A:
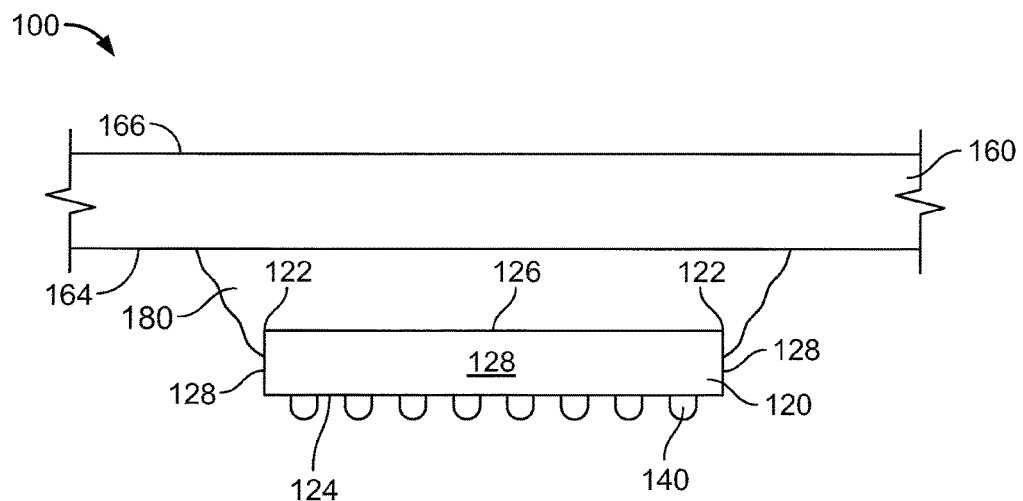
FIGS. 1A and 1B are cross-sectional schematic representations of a semiconductor package.

FIG. 1A is a cross-sectional schematic representation of a semiconductor package 100. A die 120 has a die bottom surface 124, which can be an electrically active side in some implementations, and a die top surface 126, which may sometimes be referred to as a back side. The die 120 can be composed of a substrate of a semiconductor material, for example, silicon, on which additional layers of conductive and insulative material are deposited. The die 120 can include integrated circuits, such as transistors (not shown), power switches, and power switch drivers, and other electronic components, which can be monolithically formed as part of the die 120. The die 120 can be coated with a layer of protective material, such as a thermoplastic, a thermosetting plastic, or some other suitable material. In some implementations, the die 120 can be coated with a layer of thermally conductive material, such as thermally conductive epoxy, or some other suitable material.

Conductive leads 140 can protrude from, or be formed on or in, the die bottom surface 124. The conductive leads 140 can be connected to the integrated circuits of the die 120. For example, each conductive lead 140 can be electrically connected to a conductive contact pad 144 (see FIG. 1B), which can be formed in or on an outermost layer of the die 120. Each contact pad 144 can be connected to one or more integrated circuits. In some implementations, the conductive leads 140 can be formed as rounded protrusions on the die bottom surface 124, which can be referred to as "bumps", e.g., solder bumps, e.g., in a flip chip or controlled collapse chip connection (C4) mounting arrangement. Alternatively, the conductive leads 140 can be formed as leads, such as pins or wires, that protrude from the die bottom surface 124. The conductive leads 140 can also protrude from the die narrow surfaces 128, although the contact pads 144 in such implementations are formed in or on the die bottom surface 124. In some implementations, "bumps" can occupy a smaller area than wire bonds, thereby facilitating a smaller mating area for the die 120 on a printed circuit board 370 (see FIGS. 3A-3C). Since the leads are provided directly from the bottom surface 124 of the die 120, without an interposer, the semiconductor package 100 is effectively a chip-size package for purposes of placement on the printed circuit board 370. In some implementations, the conductive leads 140 can be plated, such as with a conductive material, such as gold, silver, copper, or some other suitable material.

Figure 1B:
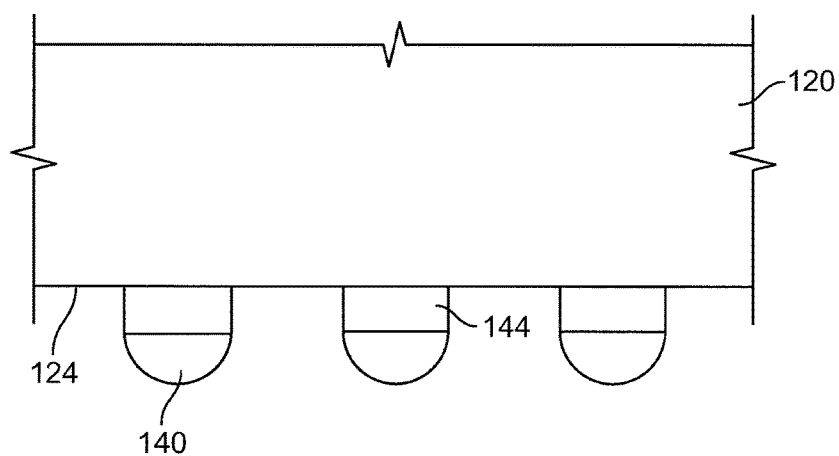

FIG. 1B is a cross-sectional schematic representation of an implementation of a portion of the semiconductor package of FIG. 1A. The conductive leads 140 are formed on contact pads 144. The contact pads 144 are formed in or on the die bottom surface 124, as described above. In this implementation, the conductive leads 140 include a flowable conductive material, such as a solder. The solder can be attached to the contact pads 144 by evaporation, electroplating, screen printing, needle-depositing, or some other suitable method or mechanism.

Referring again to FIG. 1A, a heat spreader 160 can be attached to the die 120 by an adhesive 180. The heat spreader 160 can have a heat spreader bottom 164 and a heat spreader top 166. The heat spreader bottom 164 can be arranged parallel with the die 120 and proximate the die top surface 126. The heat spreader 160 can be formed as a rigid or semi-rigid sheet of material, and can be of relative uniform thickness. The thickness can be, for example, about 0.5 millimeters (mm). The heat spreader 160 can have a Brinell hardness of 5 HB or more, such as 10 HB or more, such as 30 HB or more, such as 90 HB or more. The heat spreader 160 can have a Young's Modulus greater than 1.5 giga pascal (GPa), e.g., greater than 5.0 GPa, e.g., greater than 50 GPa, e.g., greater than 100 GPa. The heat spreader 160 can have a thermal conductivity greater than 0.5 watts per meter degree Kelvin (W/m·K), e.g., greater than 3.0 (W/m·K), e.g., greater than 30 (W/m·K), e.g., greater than 200 (W/m·K). The heat spreader 160 can be composed of a thermally conductive material, such as copper, aluminum, carbon, or some other suitable material. The heat spreader 160 can be relatively thin as compared to a heat sink 380 (see FIG. 3D). For example, the thickness of the heat spreader 160 can be of the same order of magnitude as the thickness of the die 120. For example the heat spreader 160 can be between about one fourth the thickness of the die 120 and about five times the thickness of the die 120. As a further example, a thickness of the heat sink 380 (see FIG. 3D) can be between about ten times and about one hundred times, such as about fifty times, greater than a thickness of the heat spreader 160. Further, the heat spreader 160 can have dimensions larger than the die 120 (see FIG. 3B). That is, a width of the heat spreader 160 can be larger than a width of the die 120 along a same direction. In some implementations, the heat spreader 160 is a rectangular sheet. The heat spreader top 166 can be substantially planar, e.g., lacking fins or other projections.

The adhesive 180 can be disposed between the die top surface 126 and the heat spreader bottom 164. The adhesive 180 can be, for example, a thermosetting plastic, such as an epoxy, such as a thermally conductive epoxy. The adhesive 180 can be thermally conductive, with a thermal conductivity greater than 0.5 watts per meter degree Kelvin (W/m·K), e.g., greater than 1.0 (W/m·K). The adhesive 180 can be applied in a liquid or semi-liquid form and can cure or set to a rigid form. The adhesive 180 can be applicable to the die 120, the heat spreader 160, or both. In some implementations, the adhesive 180 can be applied using printing techniques, such as screen, stencil, or jet printing. The adhesive 180 can be curable by drying, by heat, by ultraviolet light, or by some other mechanism, such as some other physical or chemical mechanism. Once dried, cured, or otherwise set, the adhesive 180 can provide a bond between the die 120 and the heat spreader 160. In some implementations, the adhesive 180 can be permanent. That is, the adhesive 180 can permanently attach the die 120 and the heat spreader 160 such that separation would likely cause damage to one or both of the die 120 and the heat spreader 160. In some other implementations, the die 120 and the heat spreader 160 can be separated by the application of heat, a chemical, or some other mechanism.

In some implementations, the adhesive 180 contacts only the die top surface 126 and the die narrow surfaces 128, as shown in FIG. 1A. In such implementations, the adhesive 180 can cover edges 122 and corners 123 of the die 120 (see FIGS. 1A and 3B), as well as the die top surface 126. The die bottom surface 124 can be free of adhesive 180. That is, in some implementations, no adhesive 180 is present on the die bottom surface 124. Also, in some further implementations, the adhesive 180 contacts only the die top surface 126.

The heat spreader 160 can include material that is more resilient than material of the die 120. For example, the heat spreader 160 can be less brittle or prone to cracking or chipping than the die 120. Also, damage to the heat spreader 160 can be less significant than damage to the die 120 because the heat spreader 160 generally does not contain sensitive components such as the integrated circuits (not shown) that are part of the die 120. That is, damage to the heat spreader 160 may be less likely to interfere with operation of the integrated circuit on the die 120 than damage to the die 120 itself. By covering the edges 122 and corners 123, for example, the heat spreader 160 can prevent or mitigate damage to the die 120 that might otherwise occur during handling of the die 120. The rigidity of the heat spreader 160 can be configured sufficiently high to protect the die 120 from damage. The rigidity of the spreader 160 can be configured sufficiently low to reduce or minimize risk of damage to the die 120 during mounting of the heat spreader 160 to the die 120.

Figure 2A:
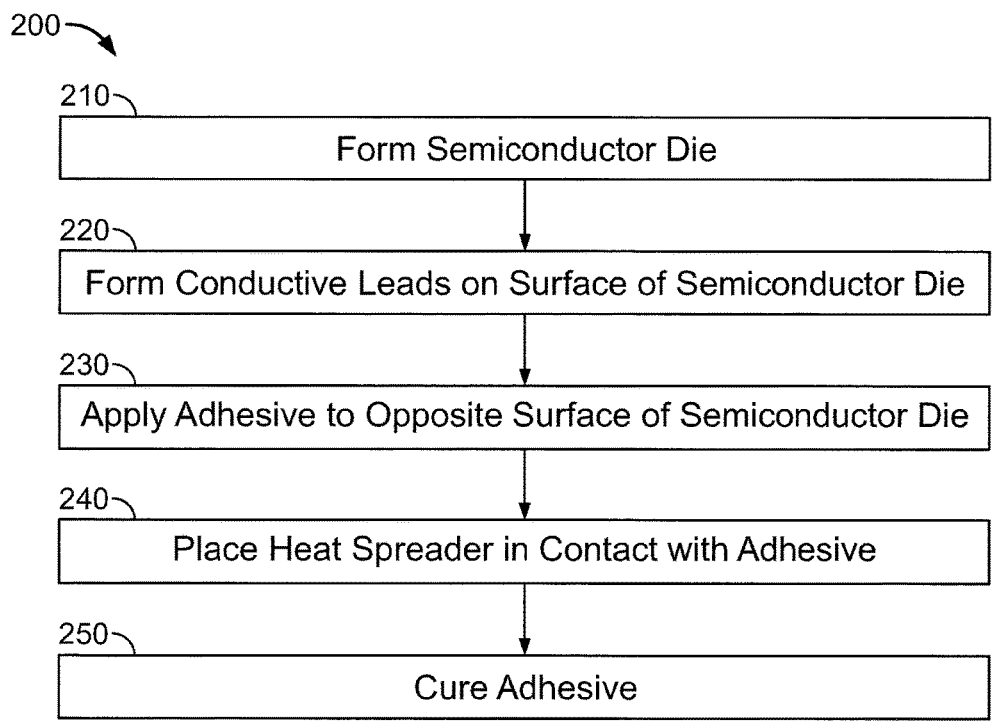
FIG. 2A is a flow diagram of a process for making a semiconductor package.
Figure 2B:
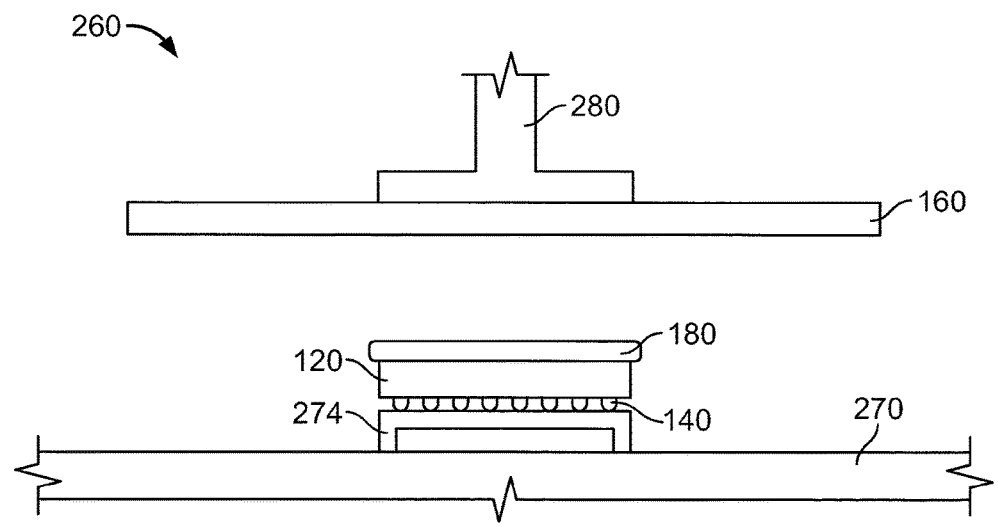
FIGS. 2B-2D are schematic representations of an apparatus for making a semiconductor package.
Figure 2C:
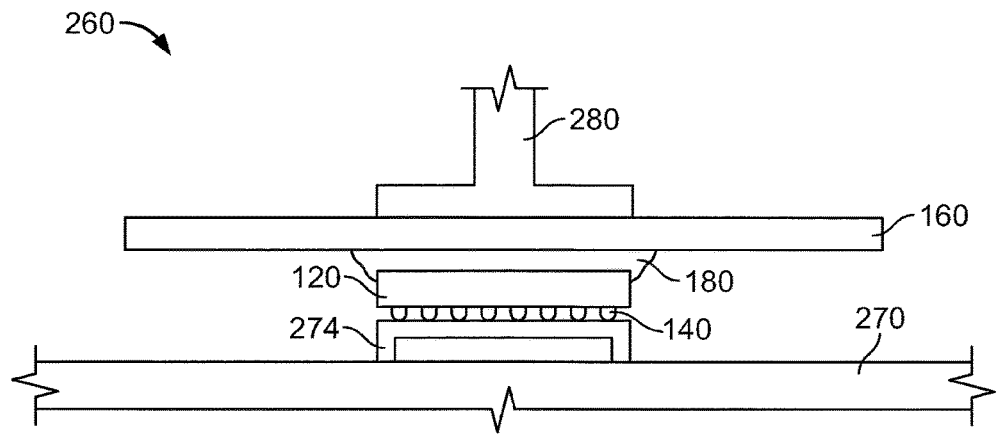
Figure 2D:
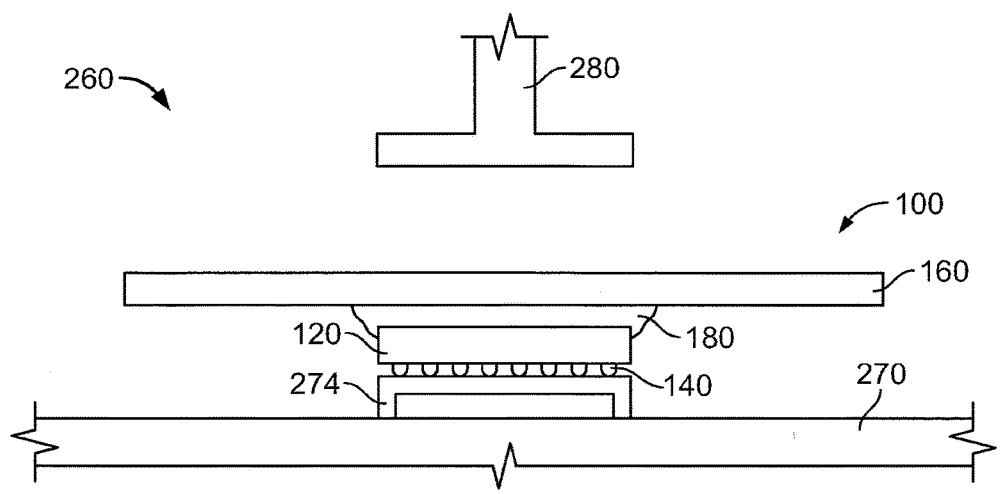

FIG. 2A is a flow diagram of a process 200 for making a semiconductor package 100. FIGS. 2B-2D show an assembler apparatus 260 for making a semiconductor package 100. The assembler apparatus 260 can include an assembler base 270 having a die support 274 disposed thereon. A heat spreader manipulator 280 is configured to releasably hold (e.g., by suction) the heat spreader 160 and to position the heat spreader 160 in contact with adhesive 180 on the die 120. The heat spreader manipulator 280 can be equipped with position sensing features and control circuitry (not shown) configured to accurately position the heat spreader 160 without causing significant damage to the die 120.

The die 120 is formed by conventional semiconductor fabrication techniques (step 210). Conductive leads 140 are formed on the die bottom surface 124 (step 220). Adhesive 180 is applied to the die top surface 126, which can be a surface opposite the die bottom surface 124 having contact pads (step 230, see FIG. 2B). Alternatively, adhesive 180 can be applied to the heat spreader bottom 164 or to both the die top surface 126 and the heat spreader bottom 164. The heat spreader 160 is then placed in contact with the adhesive 180 by the heat spreader manipulator 280 (step 240, see FIG. 2C). In some implementations, where the die 120 is positioned below the heat spreader 160 during the process 200, gravity can be permitted to hold the heat spreader 160 against the die 120 and the adhesive 180. In some implementations, the heat spreader 160 can be pressed against the die 120 during mounting. For example, the force applied can be suitable for spreading the adhesive 180 and, in some implementations, achieving a thin, uniform layer of adhesive 180. An appropriate magnitude of this force can be determined experimentally. The adhesive 180 is allowed to cure and the heat spreader manipulator 280 is retracted (step 250, see FIG. 2D). The heat spreader manipulator 280 can release the heat spreader 160 and retract before, during, or after curing of the adhesive 180. By performing this assembly process in a semiconductor fabrication facility, e.g., with precision equipment in a clean room environment, the heat spreader 160 can be positioned a precise distance from the die 120 with low danger of damage to the die 120.

Once the heat spreader 160 is attached to the die 120 to form the semiconductor package 100, further encapsulation steps can be performed, e.g., a protective coating can be applied to the lower surface of the die 120 (except for the conductive leads 140). Once assembly of the semiconductor package 100 is complete, the semiconductor package 100 can be packaged (in the conventional sense of being placed in plastic covering, e.g., a plastic bag, shrink-wrapped plastic, or plastic container that is labeled with product information and optionally sealed) for shipping to customers. However, as noted above, the semiconductor package 100 is shipped without an interposer, chip carrier, or equivalent support on the bottom side of the package.

In some implementations, multiple dies 120 are positioned in an array and a unitary heat spreader 160 is lowered onto the multiple dies 120. That is, the heat spreader 160 can be formed as a continuous sheet of material, and multiple dies 120 can be attached to this single heat spreader 160. The heat spreader 160 can then be segmented into multiple heat spreaders 160 to provide, for example, a single heat spreader 160 for each die 120. That is, the unitary heat spreader 160 with multiple dies 120 attached thereto can be singulated into multiple semiconductor packages 100.

Figure 2E:
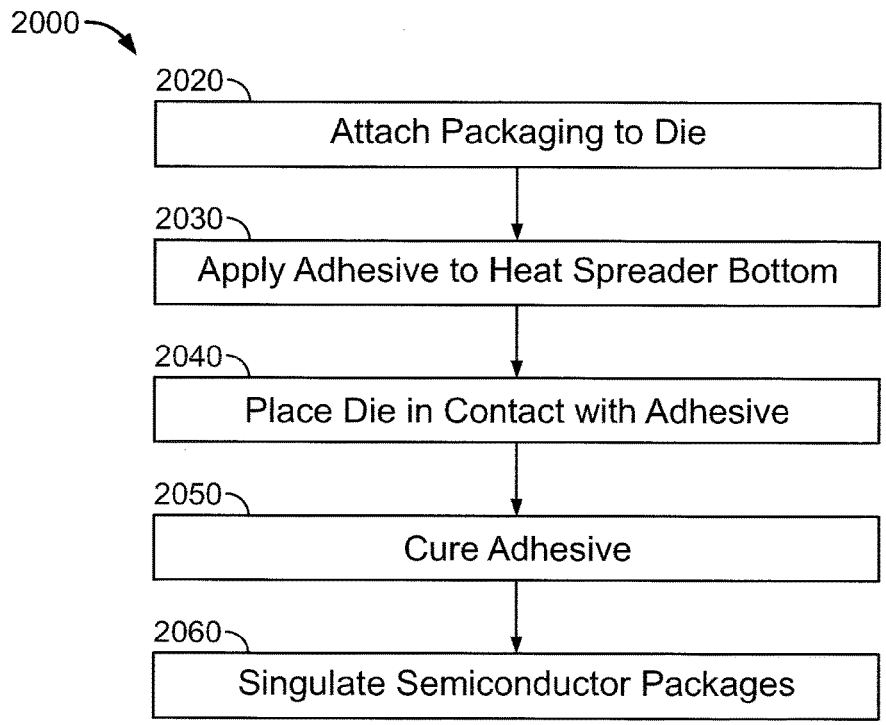
FIG. 2E is a flow diagram of an alternative process for making a semiconductor package.
Figure 2F:
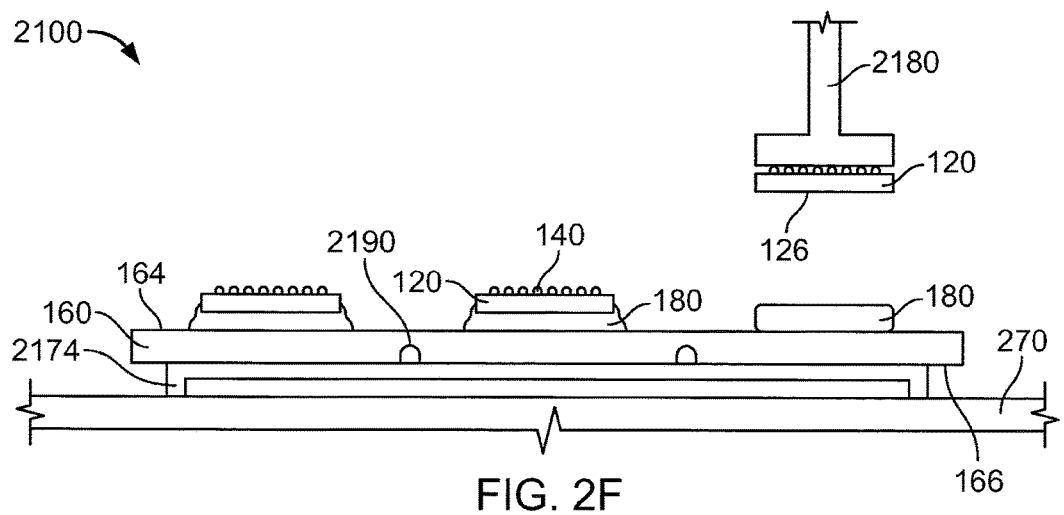
FIG. 2F is a schematic representation of an apparatus for making a semiconductor package.
Figure 2G:
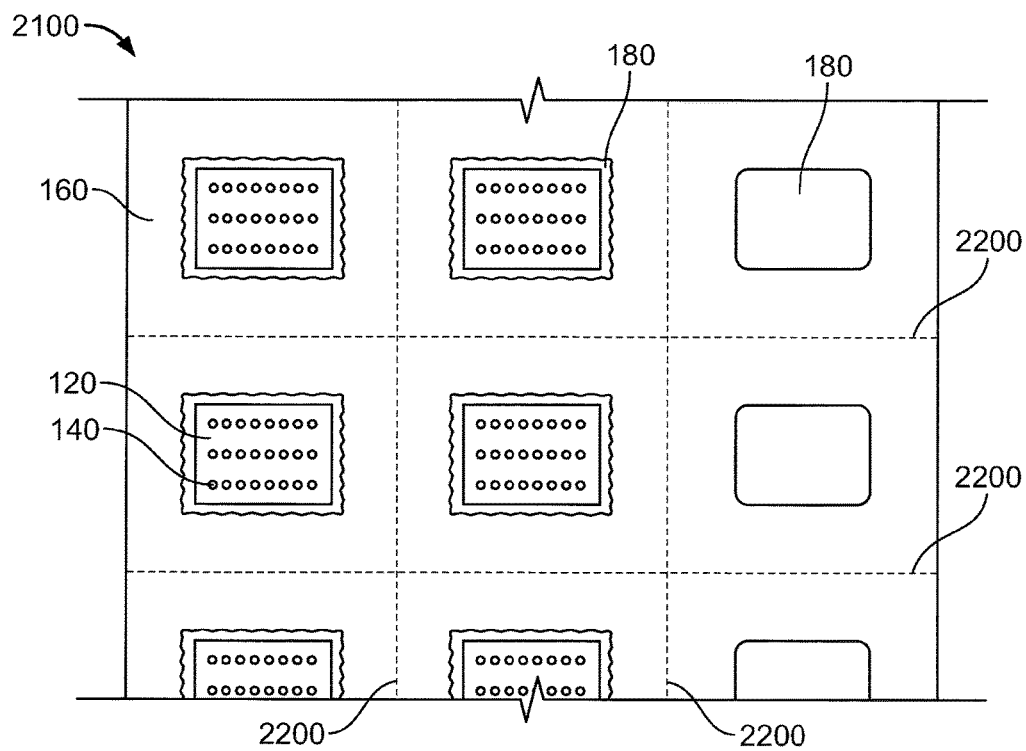
FIG. 2G is a plan view schematic representation of the apparatus of FIG. 2F.

FIG. 2E is a flow diagram of an alternative process 2000 for making a semiconductor package 100. FIG. 2F shows an assembler apparatus 2100 for making a semiconductor package 100. FIG. 2G is a plan view of the assembler apparatus 2100 of FIG. 2F. The assembler apparatus 2100 can include an assembler base 270 having a heat spreader support 2174 disposed thereon. A die manipulator 2180 is configured to releasably hold (e.g., by suction) the die 120 and to position the die 120 in contact with adhesive 180 on the heat spreader 160. The die manipulator 2180 can be equipped with position sensing features and control circuitry (not shown) configured to accurately position the die 120 without causing significant damage to the die 120. FIGS. 2F and 2G illustrate dies 120 attached to the heat spreader 160 in some locations while some other locations on the heat spreader 160 await attachment of additional dies 120, such as the die 120 releasably held by the die manipulator 2180, shown in FIG. 2F. For the sake of illustration, thicknesses of the various components shown in FIGS. 2F and 2G, such as the adhesive 180, are not necessarily shown to scale.

Referring again to FIG. 2E, packaging, described in more detail below, can be attached to the die 120 (step 2020). In some implementations, packaging can be attached after attachment of the die 120 to the heat spreader 160, after singulation, or at some other suitable point in manufacturing. Adhesive 180 can be applied to the heat spreader bottom 164, which is shown facing upward in FIG. 2F (step 2030, see FIG. 2F). Alternatively, adhesive 180 can be applied to the die top surface 126 or both the die top surface 126 and the heat spreader bottom 164. The die 120 can then be placed in contact with the adhesive 180 by the die manipulator 2180 (step 2040). In some implementations, where the die 120 is positioned above the heat spreader 160 during the process 2000, gravity can be permitted to hold the die 120 against the heat spreader 160 and the adhesive 180. In some implementations, the die 120 can be pressed against the heat spreader 160 during mounting. For example, the force applied can be suitable for spreading the adhesive 180 and, in some implementations, achieving a thin, uniform layer of adhesive 180. An appropriate magnitude of this force can be determined experimentally. The adhesive 180 can be allowed to cure and the die manipulator 2180 is retracted (step 2050). The die manipulator 2180 can release the die 120 and retract before, during, or after curing of the adhesive 180. By performing this assembly process in a semiconductor fabrication facility, e.g., with precision equipment in a clean room environment, the die 120 can be positioned a precise distance from the heat spreader 160 with low danger of damage to the die 120.

In some implementations, once multiple dies 120 are attached to the heat spreader 160, as shown in FIGS. 2F and 2G, semiconductor packages 100 can be singulated by cutting along broken lines 2200 shown in FIG. 2G (step 2060). Singulation can be facilitated by partial etchings 2190 in the heat spreader 160, such as in the heat spreader top 166. Tape (not shown) applied to the heat spreader top 166 can also facilitate singulation by improving ease of handing or reducing risk of breakage of the heat spreader 160 or other damage.

Figure 2H:
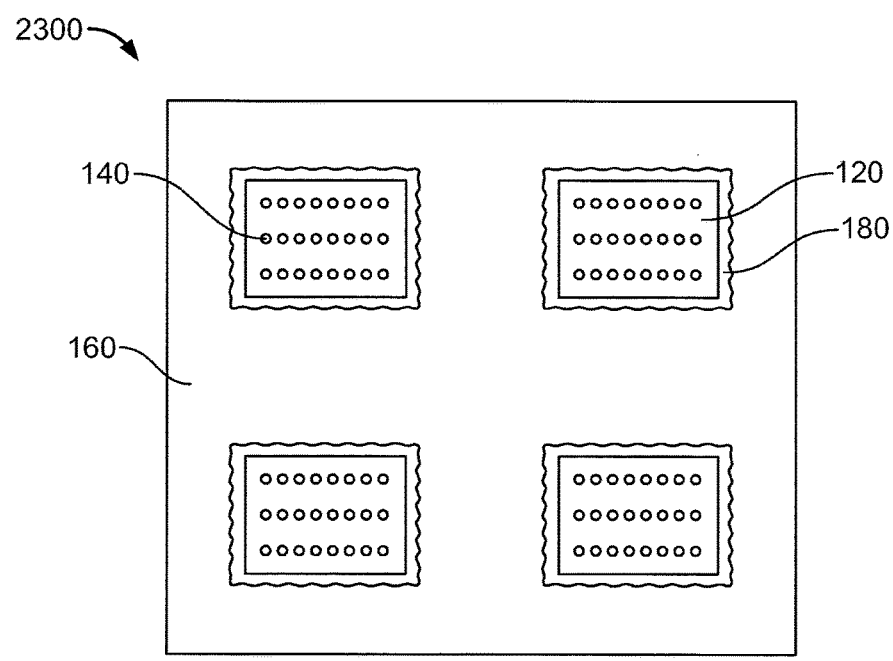
FIG. 2H is a schematic representation of a semiconductor package having multiple dies.

Alternatively, referring to FIG. 2H, multiple dies 120, e.g., a single row of dies 120 or multiple rows of dies 120, can be attached to a single, unitary heat spreader 160 to form a semiconductor package 2300 having multiple dies 120. Although FIG. 2H shows four dies, there could be two or three dies, e.g., in a single row, or five or more dies. In addition, although FIG. 2H shows each row with the same number of dies, different rows could have different numbers of dies. In addition, although FIG. 2H shows the dies arranged in a regular filled array on the unitary heat spreader 160, this is not necessary, e.g., spots in the array could lack a die or the dies could be arranged irregularly.

Figure 2I:
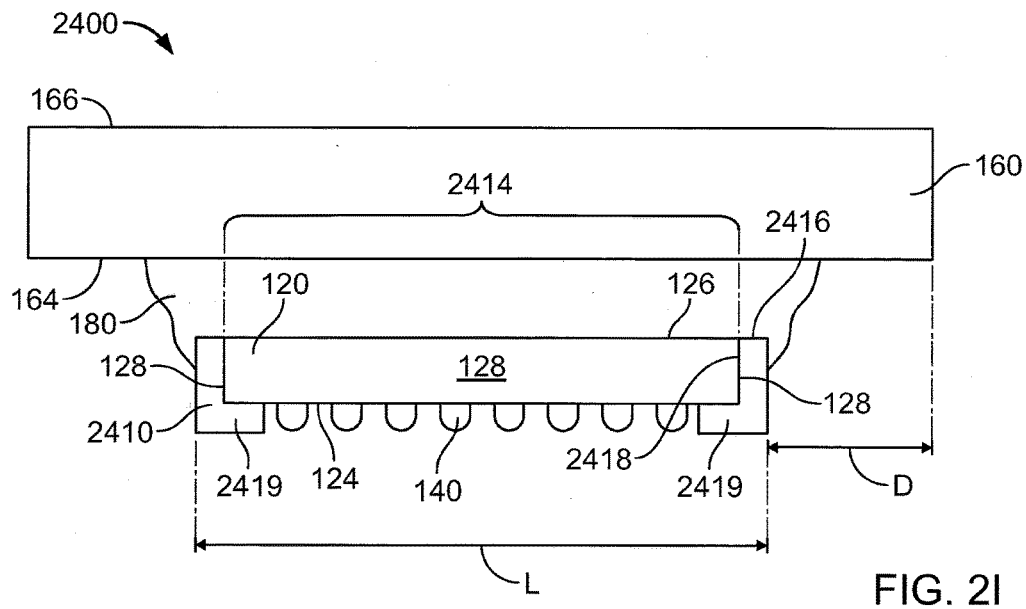
FIG. 2I is an elevation-view cross-sectional schematic representation of a semiconductor device including a holder.
Figure 2J:
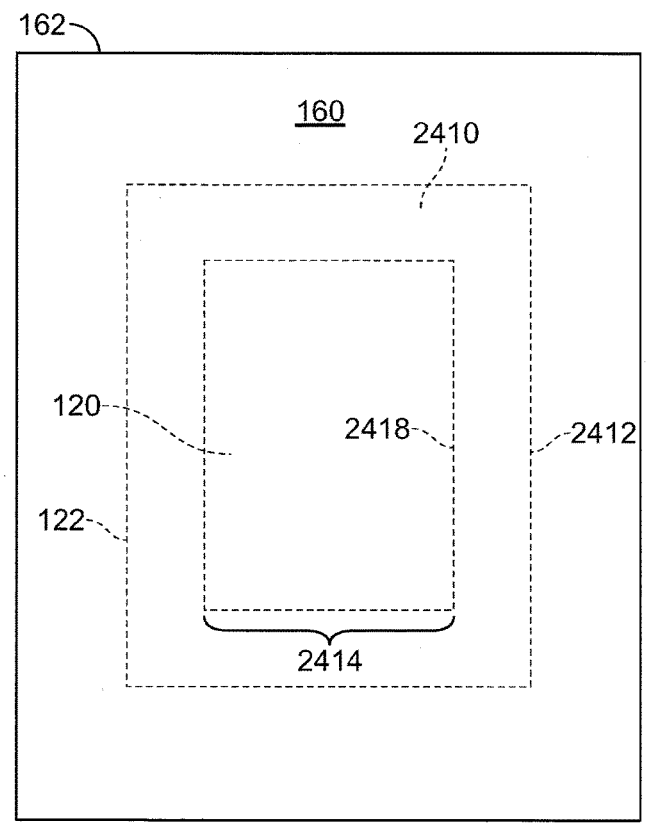
FIG. 2J is a plan-view cross-sectional schematic representation of the semiconductor package of FIG. 2I.

FIG. 2I is an elevation-view cross-sectional schematic representation of an alternative semiconductor package 2400. FIG. 2J is a plan-view cross-sectional schematic representation of the semiconductor package 2400 of FIG. 2I. The heat spreader 160 can have a thickness T. A holder 2410, which may also be described as packaging in this disclosure, can surround some or all of the die 120. The holder 2410 can be formed of plastic, e.g., an injection molded solid plastic body. The holder 2410 can have an aperture 2414 of the same size as the die 120 into which the die 120 fits, with the narrow surfaces 128 of the die 120 directly contacting the inner surface 2418 of the holder 2410 in the aperture 2414. The holder 2410 has a holder top surface 2416 that can be substantially coplanar with the die top surface 126. In some implementations, the holder 2410 is of uniform width W around the die 120. The holder 2410 can include a lip 2419 projecting inwardly from the bottom of the holder 2410. The die bottom surface 124 can rest on the lip 2419 so that the holder 2410 supports the die 120 in the aperture 2414. Alternatively or in addition, the die 120 can be press-fit into the aperture 2414.

The heat spreader 160 can cover the die top surface 126 and the holder top surface 2416. The heat spreader 160 can also extend beyond the die 120 and holder 2416 by some distance D. The distance D can be, for example, between zero and one half a length L of the die 120 and holder 2410, such as between 0 and one fifth the length L. In some implementations, a perimeter 162 of the heat spreader 160 can extend beyond, e.g., completely surround, a perimeter 2412 of the holder 2410, which may facilitate protection of the die 120 and the holder 2410 from damage. Thus, in some implementations, the heat spreader 160 can completely cover the top surfaces of the die 120 and holder 2410. However, in some implementations, apertures (e.g., 2780 in FIG. 2P) can be formed in the heat spreader 160 in a region above the die 120 so that a portion, e.g., less than all, of the top surface of the die 120 is exposed. In alternative implementations, the holder top surface 2416 can be substantially parallel but not coplanar with the die top surface 126 and configured to be proximate the adhesive 180 and the heat spreader 160. Relative dimensions of structures illustrated in FIG. 2I are not necessarily shown to scale. For example, dimensions of the holder 2410 relative to the die 120 can vary.

In some implementations, a structured sheet includes an array of multiple heat spreaders, and dies are placed on the heat spreaders in the array to form semiconductor packages before heat spreaders are singulated from the array. The resulting semiconductor packages can be attached to printed circuit boards after singulation. Thus, in some implementations, the semiconductor packages are not attached to a printed board while in the array (although the leads are configured to contact a printed circuit board). FIG. 2K is a schematic representation of a structured sheet 2500 that includes multiple heat spreaders 160 arranged in an array 2505, e.g., a regular array, e.g., a rectangular array with two or more columns and two or more rows, with adjacent heat spreaders 160 connected by struts 2510. The struts 2510 can be linear and can be short relative to the heat spreaders 160, e.g., can have a length A less than the dimension of the adjacent heat spreader 160 in a parallel direction, e.g., about 8% to about 20% of the width X of the adjacent heat spreader 160. Similarly, the struts 2510 can have a width C narrower than a dimension of the adjacent heat spreader 160, e.g., about 8% to 20% of the height Y of the adjacent heat spreader 160. In some implementations, the struts 2510 can have a thickness about equal to the thickness T (see FIG. 2I) of an adjacent heat spreader. However, the struts 2510 can also be thicker or thinner than the adjacent heat spreader. For example, the struts 2510 can be thinner than the heat spreaders to facilitate severing during singulation. The heat spreaders 160 in the array 2505 can all be the same size and thickness, or can be of different sizes and/or thicknesses.

Although FIG. 2K shows only one strut 2510 connecting each pair of adjacent heat spreaders 160, in some embodiments at least some adjacent heat spreaders 160 could be connected by two or more struts 2510, such as two or more parallel struts 2510. FIG. 2K also illustrates an optional support structure 2530 that can facilitate manufacturing. The optional support structure 2530 can be formed as part of the structured sheet 2500 and can be configured to support one or more sides of the array 2505. The support structure 2530 can extend along one side of the array 2505 of heat spreaders 160, e.g., across all the rows (or columns) of the array 2505, with each adjacent head spreader 160 connected to the support structure 2530 by a strut 2510. In some other implementations, the optional support structure 2530 can be formed as a ring (not shown) around the array 2505. In some implementations, the struts 2510 connecting the support structure 2530 to the array 2505 can be severed before singulating the heat spreaders 160 of the array 2505.

The structured sheet 2500 can be formed by starting with a continuous sheet, and punching, etching, or cutting apertures to leave the heat spreaders 150 connected by struts 2510. In some implementations, the struts are partially etched, e.g., through about half their thickness, or partially punched, e.g., a line of perforations with the perforations occupying about half of the width of the strut, to facilitate singulation of the heat spreaders 150 from the sheet 2500 and/or for stress relief during assembly processing.

FIG. 2L is a schematic representation of an array 2600 of semiconductor packages 100 in which the heat spreaders 160 are still attached with struts 2510. The portions of adjacent heat spreaders that are not connected by struts 2510 can be separated by slots 2512. Some of the heat spreaders 160 are shown with a die 120 attached thereto by adhesive 180. For illustrative purposes, some other heat spreaders 160 are shown with adhesive 180 but without a die 120 attached thereto. As an example, the array 2600 can include four semiconductor packages 100 arranged in a two-by-two configuration. That is, the array 2600 can have a length of two semiconductor packages 100 in an x direction and a length of two semiconductor packages in a y direction that is perpendicular to the x direction.

As shown, each heat spreader 160 will accept a single die 120, with all the heat spreaders 160 of the same size and all the dies 120 of the same size. However, the array could include heat spreaders 160 without devices 120 attached, there could be heat spreaders 160 with two or more dies attached, and there could be heat spreaders 160 that are of different sizes, and there could be dies that are of different sizes.

Figure 2M:
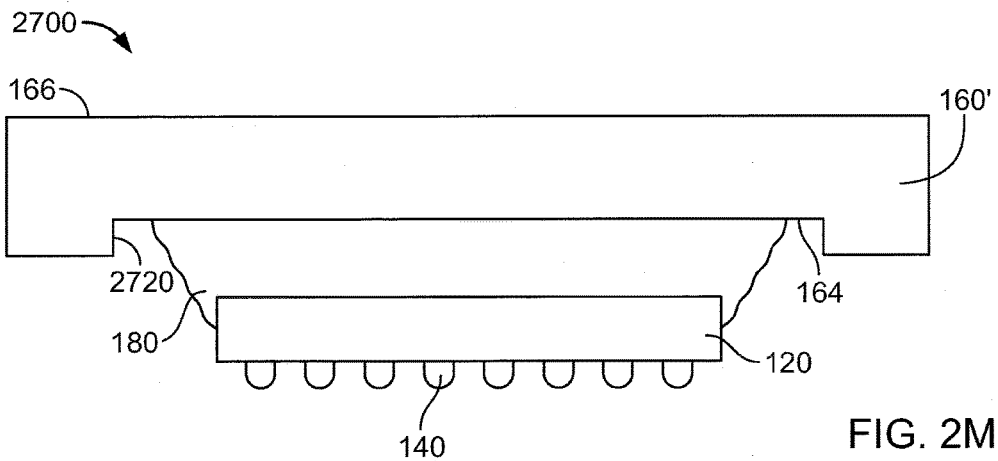
FIG. 2M is an elevation-view cross-sectional schematic representation of a semiconductor device and an alternative implementation of a heat spreader.
Figure 2N:
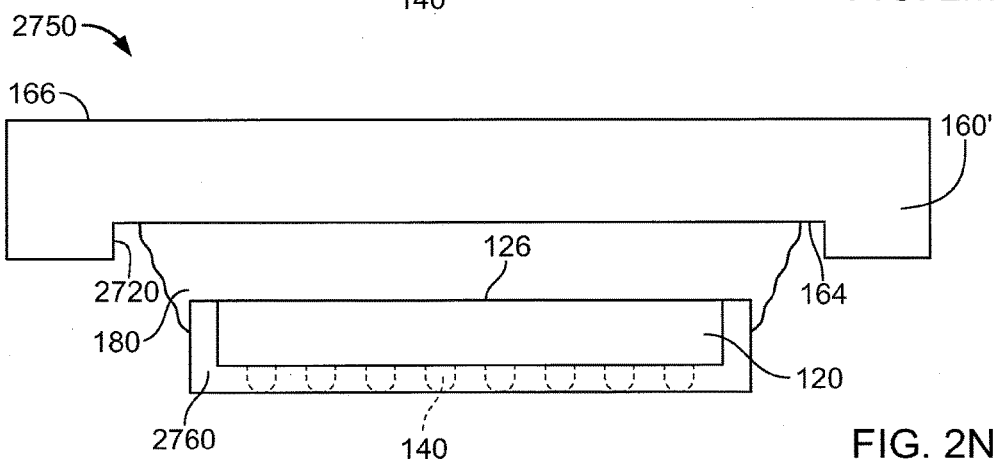
FIG. 2N is an elevation-view cross-sectional schematic representation of a semiconductor device including packaging and an alternative implementation of a heat spreader.
Figure 2O:
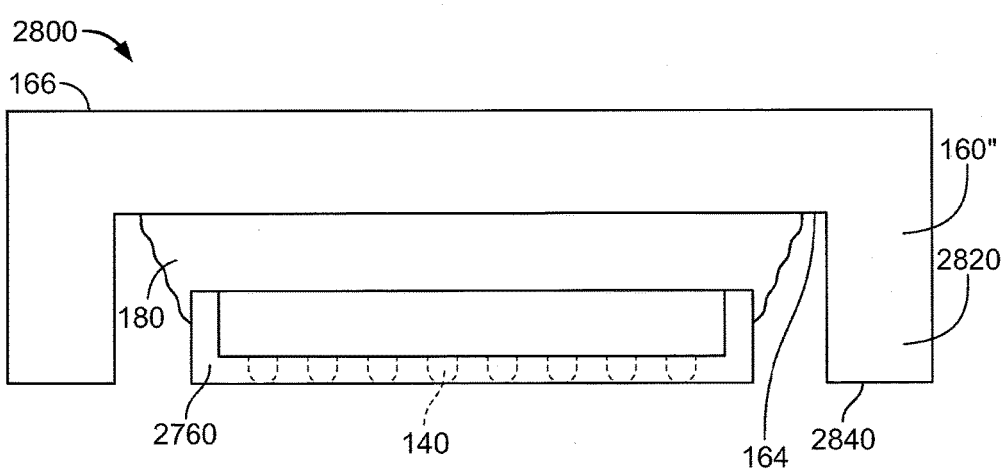
FIG. 2O is an elevation-view cross-sectional schematic representation of a semiconductor package and an alternative implementation of a heat spreader.
Figure 2P:
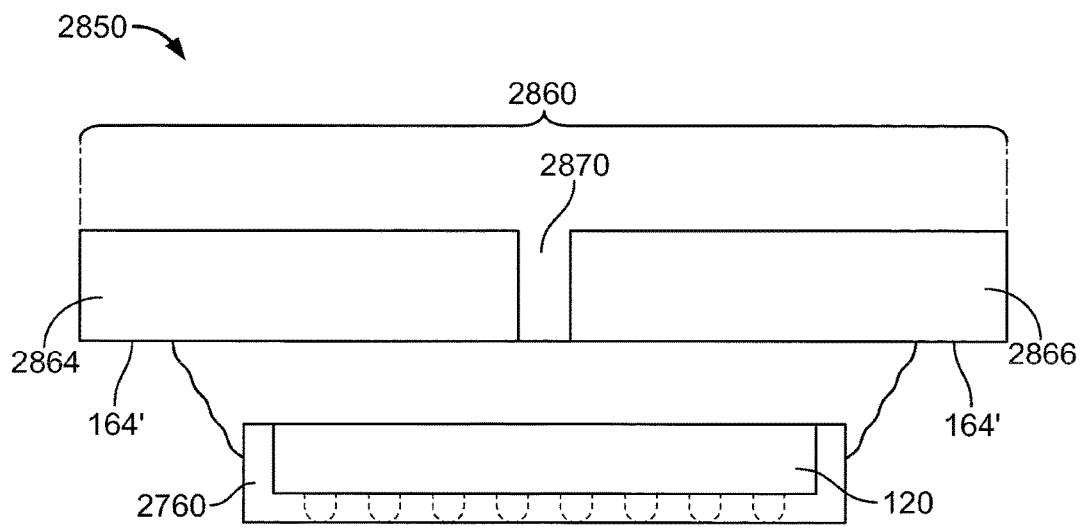
FIG. 2P is an elevation-view cross-sectional schematic representation of a semiconductor device and a split heat spreader.
Figure 2Q:
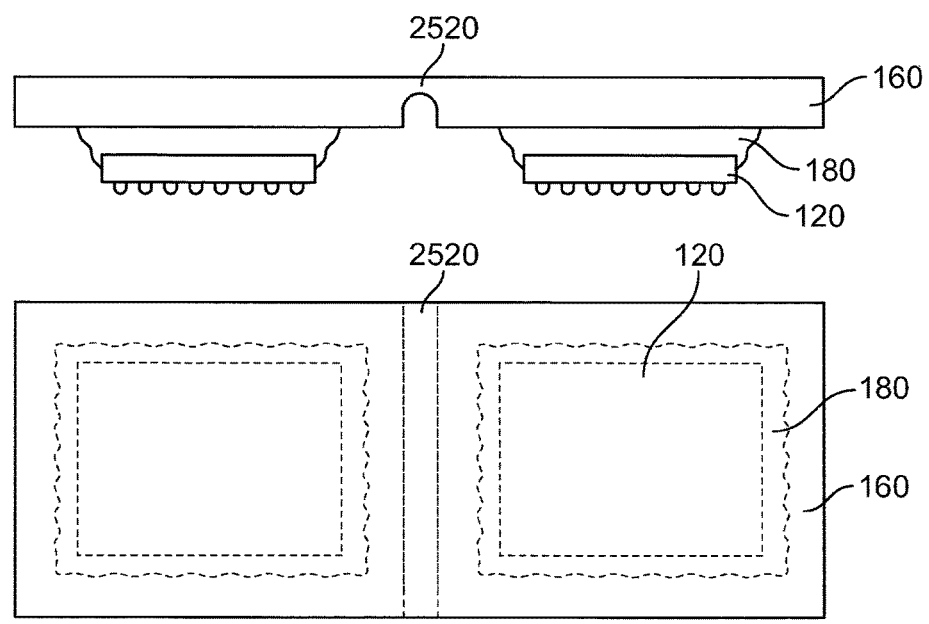
FIG. 2Q is a cross-sectional schematic representation and a plan-view schematic representation of multiple semiconductor dies on heat spreaders connected by a thin strut.
Figure 2R:
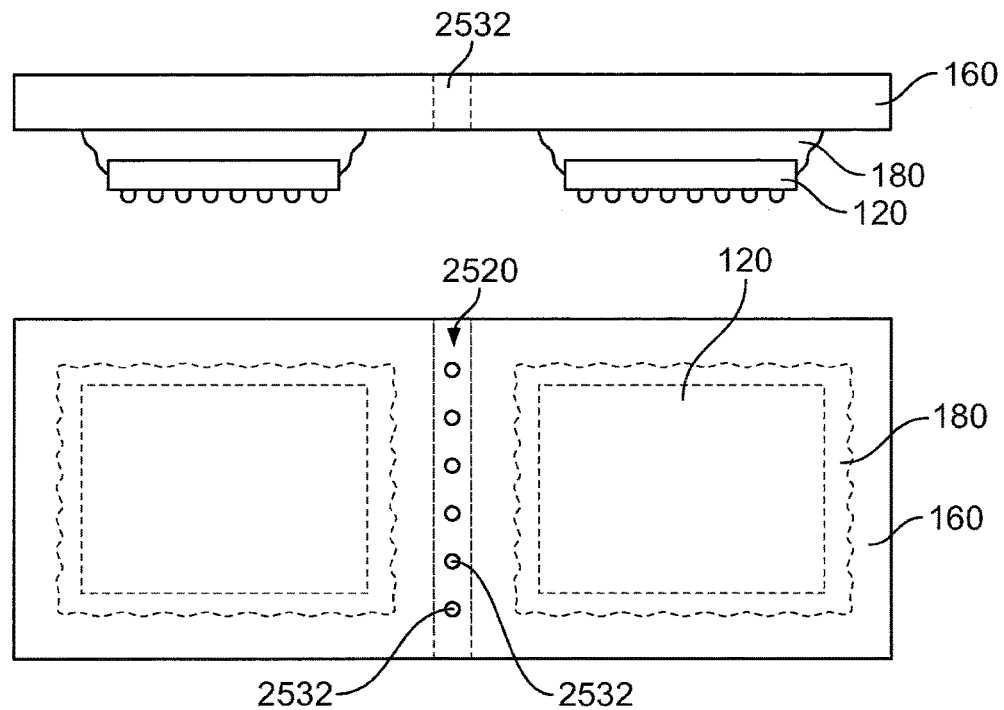
FIG. 2R is a cross-sectional schematic representation and a plan-view schematic representation of multiple semiconductor dies on heat spreaders connected by a perforated region.
Figure 2S:
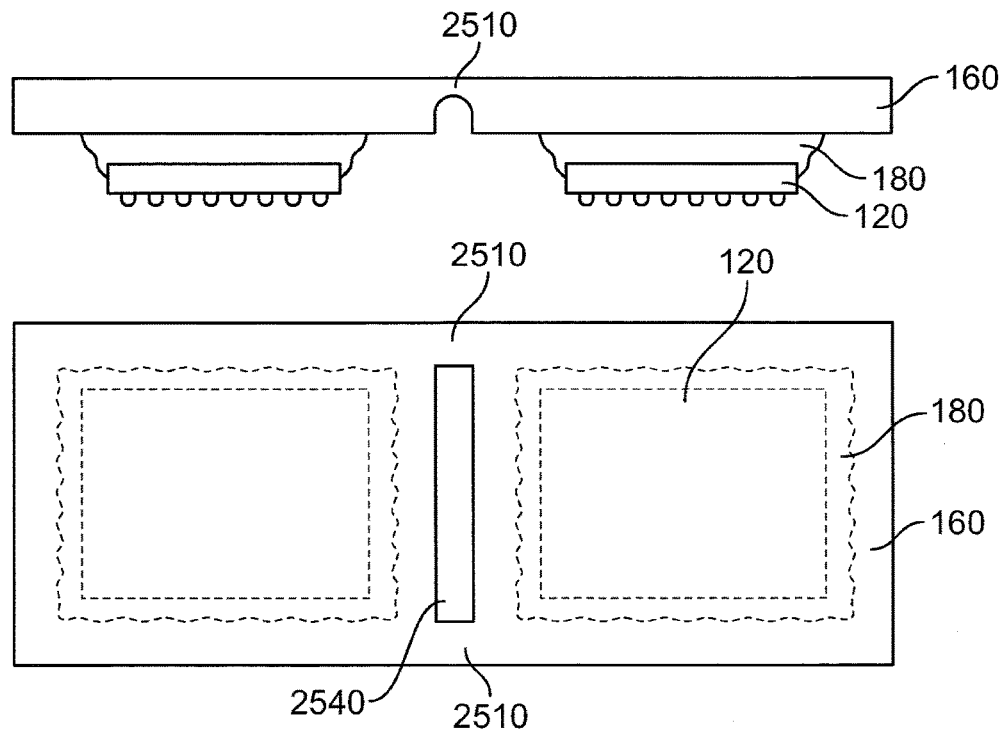
FIG. 2S is a cross-sectional schematic representation and a plan-view schematic representation of multiple semiconductor dies on heat spreaders connected by narrow struts separated by a slot.

The interface between adjacent heat spreaders 160 can be defined by section 2520 that is thinner than the adjacent spreaders (see FIG. 2Q). The thin sections 2520 can be formed by partial etching through the sheet. The interface between adjacent heat spreaders 160 can be defined by a line 2530 of perforations 2532 (see FIG. 2R) that provide a location where the heat spreaders will be severed from each other. The perforations can be formed by etching or punching. Similarly, the interface between the heat spreader and the strut could be defined by a section that is thinner than the adjacent spreader and strut, or a line of perforations, that provide a location where the strut will be severed from the heat spreader. In such implementations, the adjacent heat spreaders 160 could be connected along their entire common edge, or the struts could span the entire edge of the heat spreader 160 to which it is attached. However, as shown in FIG. 2S, one or more slots 2540 can be formed between struts 2510 that connect adjacent heat spreaders (slots 2512 can also be formed extending inwardly from edges of the heat spreader as shown in FIG. 2L). The struts 2510 can also be partially etched so that the struts are thinner than the adjacent heat spreaders 160.

The structured sheet 2500 with heat spreaders 160 connected by struts 2510 can be formed by etching, punching or cutting a metal sheet to achieve a desired pattern. The pattern can be selected to reduce warp and residual stress in the heat spreader and die during processing.

Not every heat spreader need have a die attached. In some implementations, groups of heat spreaders can be severed from the array while remaining attached to each other. However, some of the heat spreaders within the severed group may not have a die attached.

As discussed above, the heat spreaders 160 can be connected by struts 2510. One or more semiconductor packages 100 can be separated from the array 2600 by severing braces 2612. For example, semiconductor package 102 can be singulated from the array 2600 by severing the braces 2612 that connect that semiconductor package 102 to other semiconductor packages 100 of the array 2600. Singulation can be performed after dies 120 have been attached to all heat spreaders 160 that will be used, e.g., once singulation is performed, dies 120 are not attached to the unused heat spreaders 160.

FIG. 2M is an elevation-view cross-sectional schematic representation of a semiconductor device 2700 and an alternative implementation of a heat spreader 160'. The heat spreader 160' includes a recess 2720. The recess 2720 can include the heat spreader bottom 164, and the recess 2720 can be configured for the die 120 to be attached therein, such as by adhesive 180. The downwardly projecting portion 2740 that defines the recess can stop above the top surface of the semiconductor die, or the downwardly projecting portion 2740 can extend past the top surface of the semiconductor die (shown in phantom). FIG. 2N is an elevation-view cross-sectional schematic representation of a semiconductor device 2750 including packaging 2760 and an alternative implementation of a heat spreader 160'. In some implementations, the packaging 2760 can surround all surfaces of the die 120 except for the die top surface 126. The packaging 2760 can be permanently attached to the die 120. Alternatively, the packaging 2760 can be removably attached to the die 120. In some implementations, the packaging 2760 is premolded, and the die 120 can be inserted into the packaging 2760 as part of a manufacturing process. The packaging 2760 can be a molded compound, such as a plastic or an epoxy, such as, for example, EME-G770HCD multi-aromatic resin, available from Sumitomo Bakelite Co., Ltd., of Tokyo, Japan. Alternatively, the packaging 2760 can include an adhesive, e.g., an underfill adhesive. The packaging 2760 can be attached to the die 120 by an adhesive, which can be the same or different from the adhesive 180 used to attach the die 120 to the heat spreader 160. Leads 140 can extend through the packaging 2760 to have exposed surfaces for electrical connection, e.g., surfaces flush with the packaging 2760. The packaging 2760 can be combined with various other implementations, e.g., those of FIG. 2M.

A semiconductor package 100 can also include an interposer 2770, which can include a material substantially similar to a material from which the printed circuit board 370 (see FIGS. 3A-3C) can be formed. Alternatively, the interposer 2770 can be formed from a single sheet of copper alloy and etched to form electrical leads (not shown) through which the conductive leads 140 and external leads 2780 are electrically connected. The sheet of copper alloy can include, for example, Olin 194 half hard, available from Olin Corp. of Clayton, Mo. In some implementations, the external leads 2780 can be plated or coated with mat tin, copper, silver, solder, an organic solder protective layer, or some other suitable plating or coating. The interposer 2770 and external leads 2780 can optionally be combined with various other implementations, e.g., those of FIGS. 2M, 2O and 2P, or these implementations can be manufactured without an interposer.

FIG. 2O is an elevation-view cross-sectional schematic representation of a semiconductor device 2800 and an alternative implementation of a heat spreader 160". The heat spreader 160" can have one or more extensions 2820 that extend perpendicular and opposite the heat spreader top 166. The extension 2820 can surround the die 120. In some implementations, the heat spreader extension bottom surfaces 2840 are configured to attach, e.g., using a thermally conductive material, to the printed circuit board 370 to which the conductive leads 140 are configured to attach. Thus, the bottom surfaces 2840 of the extensions 2820 can be flush with the bottom surface of the leads 140, and can be plated with a coating that is wettable to solder.

FIG. 2P is an elevation-view cross-sectional schematic representation of a semiconductor device 2850 and a split heat spreader 2860. The split heat spreader can include a first heat spreader portion 2864 and a second heat spreader portion 2866. The heat spreader portions 2864, 2866 can be configured with a gap 2870 therebetween. The die 120 can be attached to heat spreader bottoms 164' of the heat spreader portions 2864, 2866. The gap 2870 can relieve stress that might otherwise be present if the heat spreader portions 2864, 2866 were unitary and continuous across the die 120. Without being limited to any particular theory, implementing the gap 2870 may reduce stresses in the die 120 that might otherwise result from thermal expansion or mechanical strain acting on a device where the heat spreader portions 2864, 2866 are part of a continuous heat spreader. In some implementations, the gap 2870 can be partially or completely filled with adhesive 180. In some implementations, rather than having two heat spreader portions, one or more apertures 2870 are formed through the heat spreader 160.

Figure 3A:
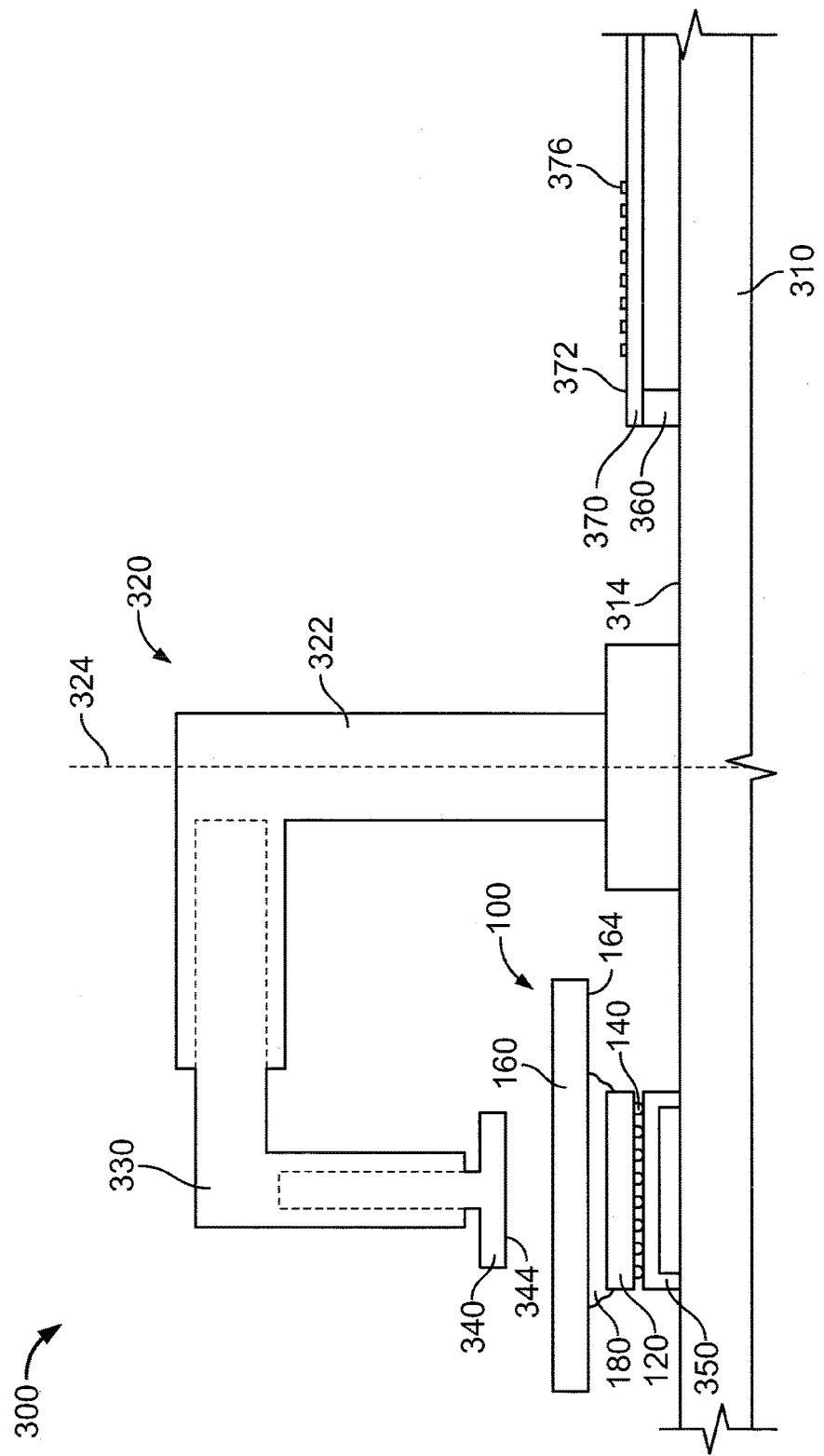
FIG. 3A is a cross-sectional schematic representation of an apparatus for handling a semiconductor package.
Figure 3B:
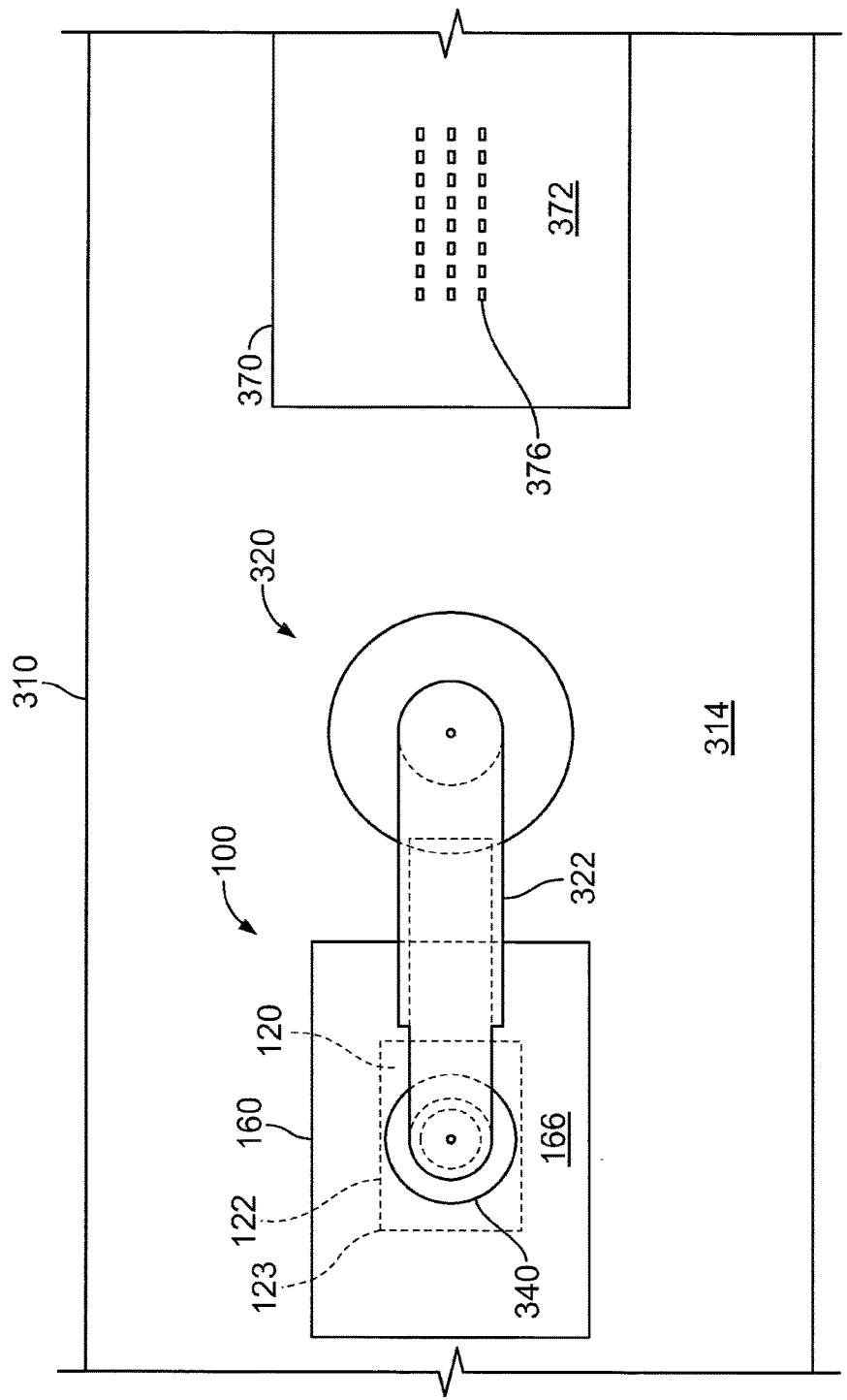
FIG. 3B is a plan-view schematic representation of the apparatus of FIG. 3A.

FIG. 3A is a cross-sectional schematic representation of a manipulator apparatus 300 for handling a semiconductor package 100. FIG. 3B is a schematic representation of a plan view of the manipulator apparatus 300 shown in FIG. 3A. Hidden boundaries between or within illustrated components are illustrated with broken lines, and components in FIGS. 3A and 3B are not necessarily shown to scale. A base 310 can include a base surface 314, and a robot 320 can be attached to the base 310. The robot 320 can include a manipulator arm 322, and actuators (not shown) can be provided to move the manipulator arm 322.

The manipulator arm 322 can include a manipulator head 340, which can include a head surface 344 that is parallel to the base surface 314. The manipulator arm 322 can include one or more suction passages (not shown) configured to apply suction to suction ports (not shown) on the head surface 344. Suction can be applied and removed to hold and release, respectively, the heat spreader 160. The head surface 344 can be of suitable size to hold a semiconductor package 100 by the heat spreader 160.

The manipulator arm 322 can be positioned near a portion of the base 310 that is configured to support a semiconductor package 100. A printed circuit board 370 can also be positioned on the base surface 314 so that at least a portion of the printed circuit board 370 is within reach of the manipulator arm 322. The printed circuit board 370 has a printed circuit board surface 372, which can include conductive portions 376. The conductive portions 376 can be configured to correspond with the conductive leads 140 of the die 120. The manipulator arm 322 can be operable to lift the semiconductor package 100 and position the semiconductor package 100 on the printed circuit board surface 372. The manipulator arm 322 can then be actuated to position the semiconductor package 100 on the printed circuit board surface 372 such that the conductive leads 140 align with the conductive portions 376.

Figure 3C:
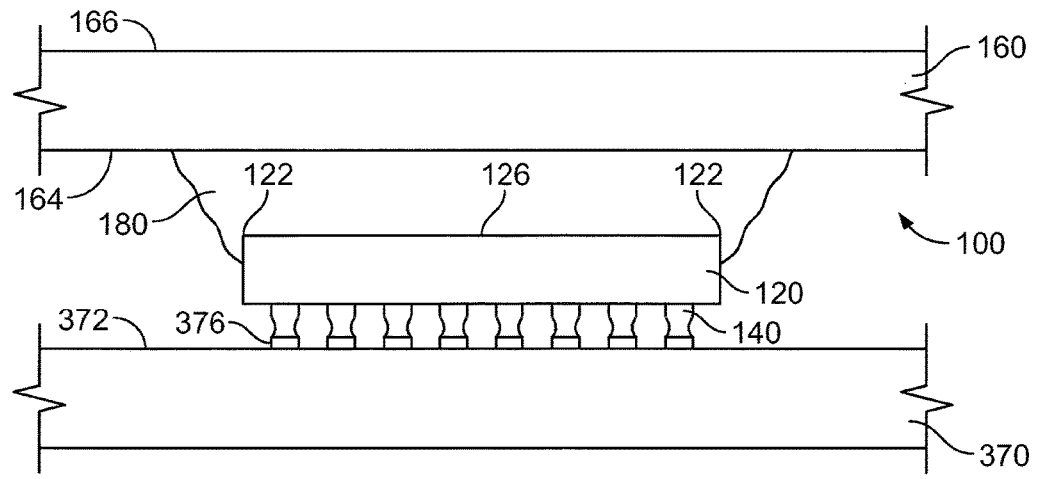
FIG. 3C is a cross-sectional schematic representation of a portion of a semiconductor package.

FIG. 3C is a cross-sectional schematic representation of a portion of a semiconductor package 100 that is positioned on a printed circuit board surface 370. The conductive leads 140 on the die 120 are aligned with the conductive portions 376 on the printed circuit board surface 372. Dimensions of the conductive leads 140 and the conductive portions 376 have been exaggerated in FIG. 3C for illustrative purposes. In the implementation shown in FIG. 3C, the die 120 is attached to the printed circuit board 370 without use of an intermediate component such as an interposer. For example, the die 120 can be a flip-chip-type semiconductor die, and the conductive leads 140 can be directly attached to the printed circuit board 370. Where the conductive leads 140 include solder, this direct attachment can be done using heat, ultrasound, or some other suitable mechanism for directly mechanically and electrically attaching the die 120 to the printed circuit board 370.

Figure 3D:
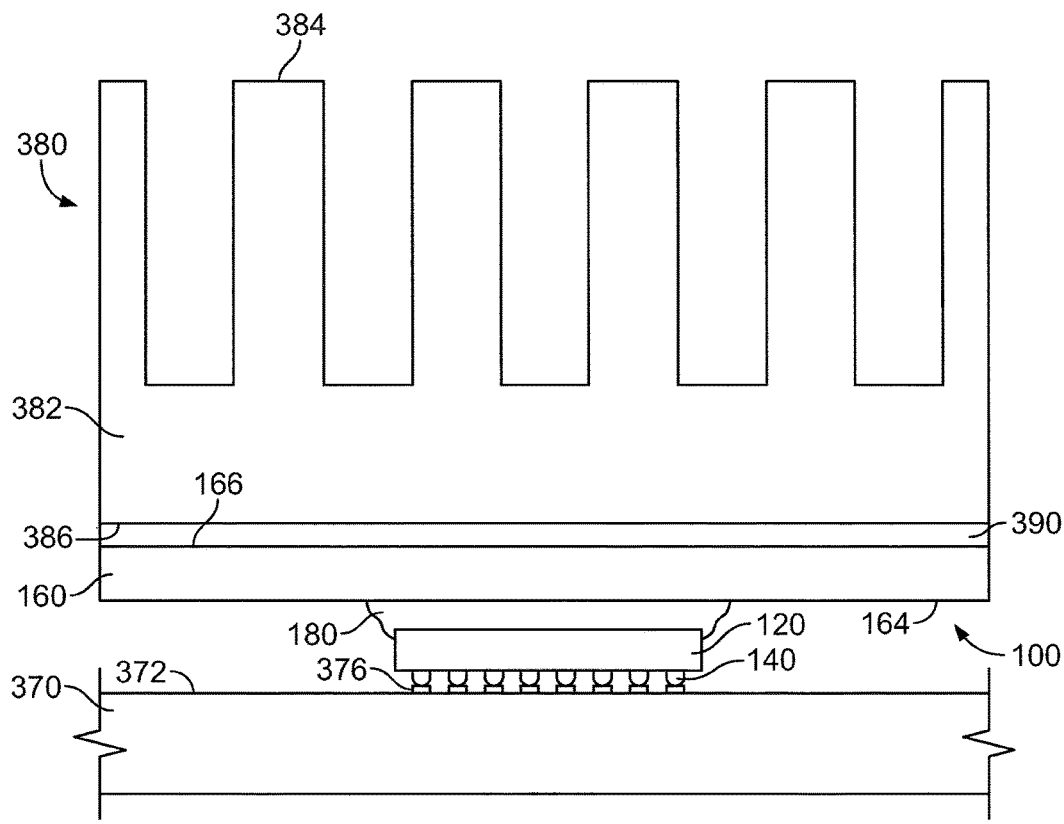
FIG. 3D is a cross-sectional schematic representation of a semiconductor package.

FIG. 3D is a cross-sectional schematic representation showing the semiconductor package 100 of FIG. 3C and a heat sink 380 attached thereto. Dimensions of the conductive leads 140 and the conductive portions 376 have been exaggerated in FIG. 3D for illustrative purposes. The heat sink 380 can be a unitary body of material and can include a main body 382 with fins 384 projecting therefrom. The heat sink 380 can include a thermally conductive material such as copper, aluminum, magnesium, carbon, aluminum silicon carbide, or some other suitable material. The heat sink 380 can be configured to transfer heat from the die 120 to a surrounding environment. That is, where the surrounding environment includes air, the heat sink 380 can be configured to transfer heat from a conductive medium, such as the heat spreader 160, to a convective medium, such as air in the surrounding environment. For example, size, shape, and number of the fins 384 can be configured to provide a desired heat transfer between the die 120 and a surrounding environment or to maintain the die 120 within a desired temperature range.

The heat sink 380 has a heat sink bottom surface 386 that can be attached to the heat spreader 160 with a heat sink adhesive 390. The heat sink adhesive 390 can be a thermally conductive adhesive, such as a thermally conductive epoxy. In some implementations, the heat sink 380 can be attached to the heat spreader by a fastener (not shown), such as a screw, a pin, or some other suitable mechanism. Where a mechanical mechanism is used to attach the heat sink 380 to the heat spreader 160, a thermally conductive paste or pad can be provided between the heat sink 380 and the heat spreader 160 to facilitate thermal conduction between the heat sink 380 and the heat spreader 160. Alternatively, the heat sink 380 can be attached directly to the heat spreader 160 without any thermal paste or other conductive material disposed between the heat sink 380 and the heat spreader 160.

Figure 4:
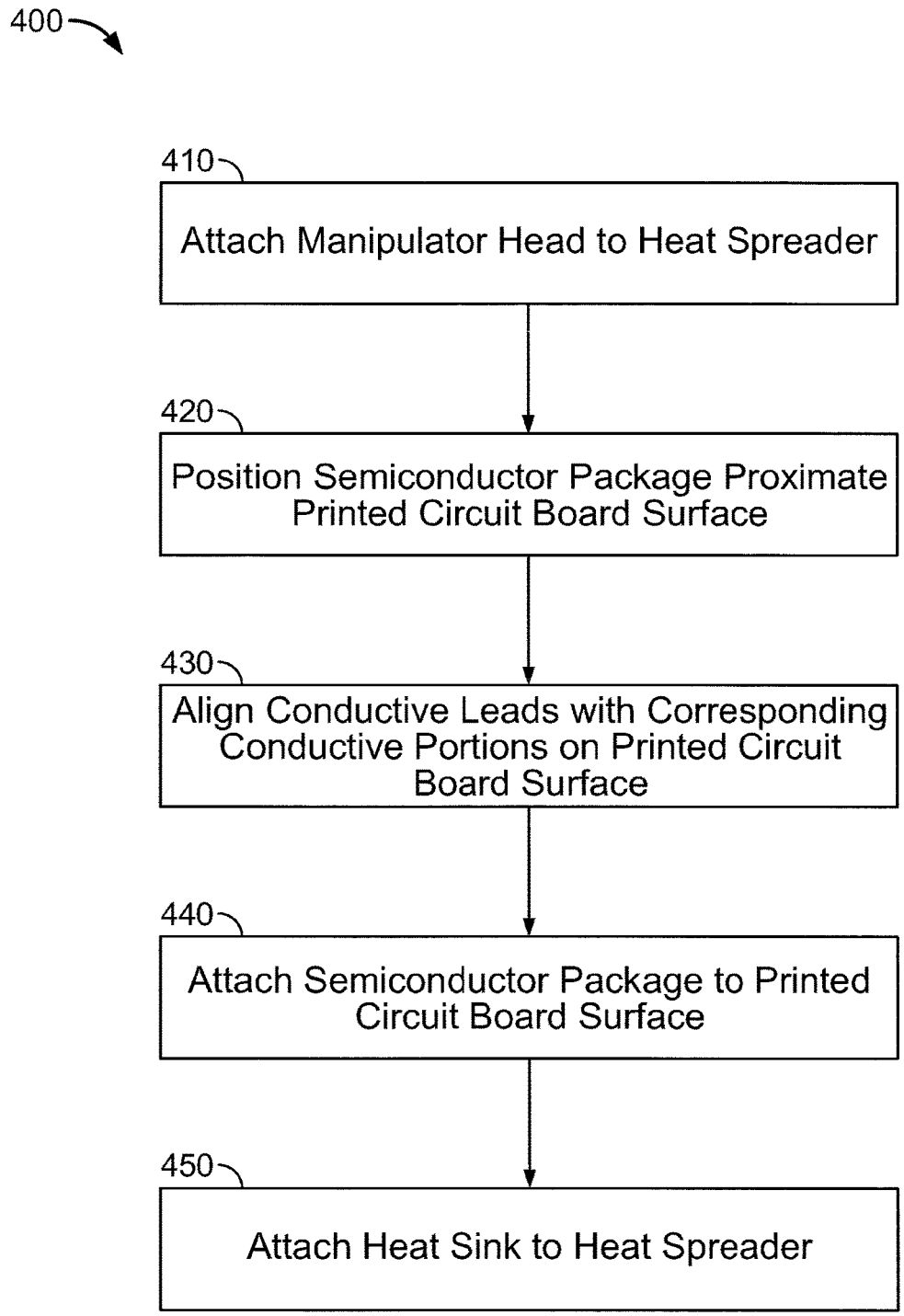
FIG. 4 is a flow diagram of a process for mounting a semiconductor package.

FIG. 4 is a flow diagram of a process 400 for mounting a semiconductor package 100. The manipulator head surface 344 can be attached to the heat spreader 160 of the semiconductor package 100 (step 410). That is, in some implementations, the heat spreader 160 is already attached to the die 120 before the die 120 is attached to the printed circuit board 370. The manipulator arm assembly 320 can be actuated to position the semiconductor package 100 proximate the printed circuit board 370 (step 420). The conductive leads 140 can be aligned with corresponding conductive portions 376 on the printed circuit board surface 372 (step 430). The semiconductor package 100 can be attached to the printed circuit board surface 372 (step 440). In some implementations, such as shown in FIG. 2O, extensions 2820 of the heat spreader 160" can be attached to the printed circuit board surface 372. The heat spreader 160 can be released from the manipulator head surface 344, and the heat sink 380 can be attached to the heat spreader 160 by the heat sink adhesive 390 (step 450).

Having the heat spreader 160 attached to the die 120 before mounting the die 120 on the printed circuit board 370 can protect the die 120 from damage. For example, the heat spreader 160 can protect the die 120 from damage that could be caused by bringing the manipulator head surface 344 into direct contact with the die 120. Also, attaching the heat spreader 160 to the die 120 can be less likely to cause damage to the die 120 than attaching the heat sink 380 directly to the die. Without being limited to any particular theory, the lighter weight of the heat spreader 160 as compared to the heat sink 380 can result in reduced forces applied to the die 120. Likelihood of damage to the die 120 may thereby be reduced. That is, mounting the relatively light heat spreader 160 to the die 120 can be less likely to damage the die 120 than mounting the relatively heavy heat sink 380 to the die 120. Further, the heat spreader 160 can be more flexible than the heat sink 380 in some implementations. This greater flexibility of the heat spreader 160 may result from a smaller thickness of the heat spreader 160 as compared to the heat sink 380. This flexibility may reduce the risk of damage to the die 120 since contact between the heat spreader 160 and the die 120 may bend the heat spreader 160 rather than break or damage the die 120. Having the heat spreader 160 attached to the die 120 can thus protect the die 120 from damage that might otherwise be caused by mounting the heat sink 380.

The above-described implementations can provide none, some, or all of the following advantages. Packaging the die with the heat spreader can mitigate or prevent damage to the die during handling of the die, mounting of the die to a printed circuit board, or mounting of a heat sink to the die. The heat spreader can be used for easily and safely handling the die. The heat spreader can serve as an attachment point for various heat sinks that can each be suitable for a particular operating environment. The heat spreader can spread heat from the die evenly across the heat sink bottom surface, which can facilitate heat transfer between the die and the heat sink and thereby reduce necessary heat sink size or capacity. Having a heat spreader, rather than a heat sink, attached to the die prior to attaching the die to a printed circuit board can also mitigate or prevent damage to the die during shipping and handling. That is, acceleration or inertial forces imparted by the relatively small mass of the heat spreader, as compared to the relatively large mass of the heat sink, may be less likely to damage the die.

The use of terminology such as "upper," "lower," "top," "bottom," "above," and "below" throughout the specification and claims is for illustrative purposes only, to distinguish between various components and portions of components. The use of such terminology does not imply a particular orientation of any component. Similarly the use of any horizontal or vertical terms to describe elements is in relation to the implementations described. In other implementations, the same or similar elements can be oriented other than horizontally or vertically as the case may be. In addition, it should be understood that terminology such as "flush" or "coplanar" can include manufacturing tolerances.

A number of embodiments have been described. Nevertheless, it will be understood that various modifications may be made without departing from the spirit and scope of the subject matter described. For example, the heat spreader can be flexible rather than rigid. Also, the heat spreader can be composed of a thermally insulating material rather than a thermally conductive material. Further, the adhesive between the die and the heat spreader can be curable to a semi-rigid or flexible form rather than a rigid form. Accordingly, other embodiments are within the scope of the following claims.

What is claimed is:

1. A chip-scale semiconductor package for placing on a printed circuit board, comprising:
   a semiconductor die having a top surface and an opposing bottom surface;
   packaging at least partially surrounding the semiconductor die and presenting an outer-surface made-ready for contacting the printed circuit board;
   a plurality of conductive leads electrically coupled to the semiconductor die, each of the plurality of conductive leads extending from the bottom surface of the semiconductor die to the outer surface of the packaging to have at least one exposed surface for electrical connection to the printed circuit board; and a heat spreader assembly configured to cover the top surface, the heat spreader assembly being attached to the die in a first direction perpendicular to the top surface by a layer of adhesive positioned between the heat spreader assembly and the die, a perimeter of the heat spreader assembly extending beyond a perimeter of the packaging, the heat spreader assembly including at least one aperture overlapping with the top surface in the first direction.

2. The chip-scale semiconductor package of claim 1, wherein the aperture is filled with the adhesive.

3. The chip-scale semiconductor package of claim 1, wherein the heat spreader assembly comprises a unitary body.

4. The chip-scale semiconductor package of claim 1, wherein the heat spreader assembly includes a plurality of coplanar portions separated by at least one gap, the gap providing the at least one aperture.

5. The chip-scale semiconductor package of claim 4, wherein the perimeter of the heat spreader assembly includes at least one downwardly projecting portion.

6. The chip-scale semiconductor package of claim 4, wherein the plurality of coplanar portions are not part of a unitary body.

7. The chip-scale semiconductor package of claim 1, wherein the at least one aperture extends completely through the heat spreader assembly in the first direction.

\* \* \* \* \*